(12) United States Patent
Chen et al.

(10) Patent No.: US 7,633,079 B2
(45) Date of Patent: Dec. 15, 2009

(54) PROGRAMMABLE FUSE/NON-VOLATILE MEMORY STRUCTURES IN BEOL REGIONS USING EXTERNALLY HEATED PHASE CHANGE MATERIAL

(75) Inventors: Kuang-Neng Chen, White Plains, NY (US); Bruce G. Elmegreen, Golden Bridge, NY (US); Deok-Kee Kim, Bedford Hills, NY (US); Chandrasekharan Kothandaraman, Hopewell Junction, NY (US); Lia Krusin-Elbaum, Dobbs Ferry, NY (US); Chung H. Lam, Peekskill, NY (US); Dennis M. Newns, Yorktown Heights, NY (US); Byeongju Park, Plainview, NY (US); Sampath Purushothaman, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 266 days.

(21) Appl. No.: 11/850,742

(22) Filed: Sep. 6, 2007

(65) Prior Publication Data
US 2009/0065761 A1    Mar. 12, 2009

(51) Int. Cl.
*H01L 47/00* (2006.01)
(52) U.S. Cl. ............... 257/4; 257/42; 257/E21.068; 438/102
(58) Field of Classification Search ............ 257/4, 257/42, E21.068; 438/102
See application file for complete search history.

(56) References Cited

U.S. PATENT DOCUMENTS

| | | | |
|---|---|---|---|
| 6,448,576 B1 | 9/2002 | Davis et al. | |
| 6,912,146 B2 | 6/2005 | Gill et al. | |
| 6,970,034 B1 | 11/2005 | Harris | |
| 7,026,639 B2 | 4/2006 | Cho et al. | |
| 7,196,346 B2 | 3/2007 | Okuno | |
| 7,208,751 B2 | 4/2007 | Ooishi | |
| 7,221,579 B2 | 5/2007 | Krusin-Elbaum et al. | |
| 7,324,365 B2 | 1/2008 | Gruening-von Schwerin et al. | |
| 7,388,273 B2 * | 6/2008 | Burr et al. | 257/529 |
| 7,391,642 B2 | 6/2008 | Gordon et al. | |
| 7,411,818 B1 | 8/2008 | Elmgreen et al. | |

(Continued)

OTHER PUBLICATIONS

U.S. Appl. No. 11/958,298, filed Dec. 17, 2007.

(Continued)

*Primary Examiner*—Trung Dang
(74) *Attorney, Agent, or Firm*—Cantor Colburn LLP; Vazken Alexanian

(57) ABSTRACT

A programmable phase change material (PCM) structure includes a heater element formed at a BEOL level of a semiconductor device, the BEOL level including a low-K dielectric material therein; a first via in electrical contact with a first end of the heater element and a second via in electrical contact with a second end of the heater element, thereby defining a programming current path which passes through the first via, the heater element, and the second via; a PCM element disposed above the heater element, the PCM element configured to be programmed between a lower resistance crystalline state and a higher resistance amorphous state through the use of programming currents through the heater element; and a third via in electrical contact with the PCM element, thereby defining a sense current path which passes through the third via, the PCM element, the heater element, and the second via.

20 Claims, 20 Drawing Sheets

U.S. PATENT DOCUMENTS

| | | | |
|---|---|---|---|
| 2005/0121789 | A1 | 6/2005 | Madurawe |
| 2005/0158950 | A1 | 7/2005 | Scheuerlein et al. |
| 2005/0188230 | A1 | 8/2005 | Bilak |
| 2006/0278895 | A1 | 12/2006 | Burr et al. |
| 2006/0279978 | A1 | 12/2006 | Krusin-Elbaum |
| 2007/0096071 | A1 | 5/2007 | Kordus, II et al. |
| 2007/0099405 | A1 | 5/2007 | Oliva et al. |
| 2007/0295948 | A1 | 12/2007 | Lam et al. |
| 2008/0012094 | A1* | 1/2008 | Ma et al. .................... 257/614 |
| 2008/0017842 | A1 | 1/2008 | Happ et al. |
| 2008/0044632 | A1* | 2/2008 | Liu et al. .................... 428/192 |
| 2008/0048169 | A1 | 2/2008 | Doyle et al. |
| 2008/0158942 | A1* | 7/2008 | Nirschl et al. ............... 365/163 |
| 2008/0210925 | A1 | 9/2008 | Krusin-Elbaum et al. |
| 2009/0033358 | A1 | 2/2009 | Chen et al. |
| 2009/0033360 | A1 | 2/2009 | Chen et al. |

OTHER PUBLICATIONS

U.S. Appl. No. 11/672,110, filed Feb. 7, 2007.
U.S. Appl. No. 11/833,321, filed Aug. 2, 2007.
U.S. Appl. No. 11/833,354, filed Aug. 3, 2007.
"Exploring Potential Benefits of 3D FPGA Integration" 1-6 pages.
Jpn. J. Appl. Phys. vol. 40 (2001) Part 2, No. 6B, Jun. 15, 2001, "Temperature Dependence of TaSiN Thin Film Resistivity from Room Temperature to 900° C.", Munenori Oizumi, Katsuhiro Aoki, and Yukio Fukuda, pp. L603-L605.
Journal of Applied Physics, vol. 86, No. 4, Aug. 15, 1999, "Modeling of laser pulsed heating and quenching in optical data storage media", C. A. Volkert and M. Wuttig, pp. 1808-1816.
J. Appl. Phys. 82 (9), Nov. 1, 1997, "Experimental and theoretical investigations of laser-induced crystallization and amorphization in phase-change optical recording media", Chubing Peng, Lu Cheng, and M. Mansurpur, pp. 4183-4191.
Physical Review Letters, vol. 64, No. 11, Mar. 12, 1990, "Asymmetric Crystallization and Melting Kinetitcs in Sodium: A Molecular-Dynamic Study", C. J. Tymczak and John R. Ray, pp. 1278-1281.
Jpn. J. Appl. Phys. vol. 42 (2003), Part 1, No. 2B, Feb. 2003, "Determination of the Crystallisation Kinetics of Fast-Growth Phase-Change Materials for Mark-Formation Prediction", Erwin R. Meinders and Martijn H. R. Lankhorst, pp. 809-812.
Science, vol. 267, Mar. 31, 1995, "Formation of Glasses from Liquids and Biopolymers", C. A. Angell, pp. 1924-1934.
Journal of Applied Physics 97, 083520 (2005), "Phase-change recording materials with a growth-dominated crystallization mechanism: A materials overview", L. van Pieterson, M. H. R. Lankhorst, M. van Schijndel, A. E. T. Kuiper, and J. H. J. Roosen, 1-7 pages.
file://C:\DOCUME~1\ADMINI~1\LOCALS~\Temp\V9K43UPW. htm, Jul. 20, 2005, "What Are CPLDs and FPGAs", 1-3 pages.
S. Lai et al; "OUM—A 180 nm Nonvaltile Memory Cell Element Technology for Stand Alone and Embedded Applications;" IEEE, 2001, pp. 36.5.1-36.5.4.
J. Maimon et al; "Chalcogenide-Based Non-Volatile Memory Technology;" IEEE; 2001 pp. 5-2289-5-2294.
Young-Tae Kim et al.; "Study on Cell Characteristics of PRAM Using the Phase-Change Simulation;" IEEE 2003; pp. 211-214.
S. Tyson et al.; "Nonvolatile, High Density, High Performance Phase-Change Memory;" IEEE 2000; pp. 385-390.
C.J. Glassbrenner et al.; "Thermal Conductivity of Silicon and Germanium from 3° K to the Melting Point*;" Physical Review vol. 134, No. 4A; May 18, 1964; pp. A1058-A1069.

* cited by examiner

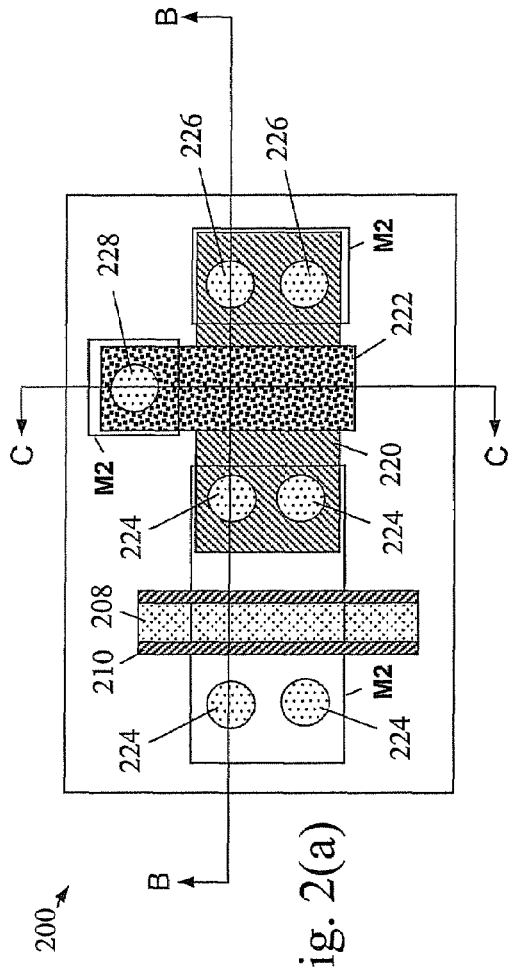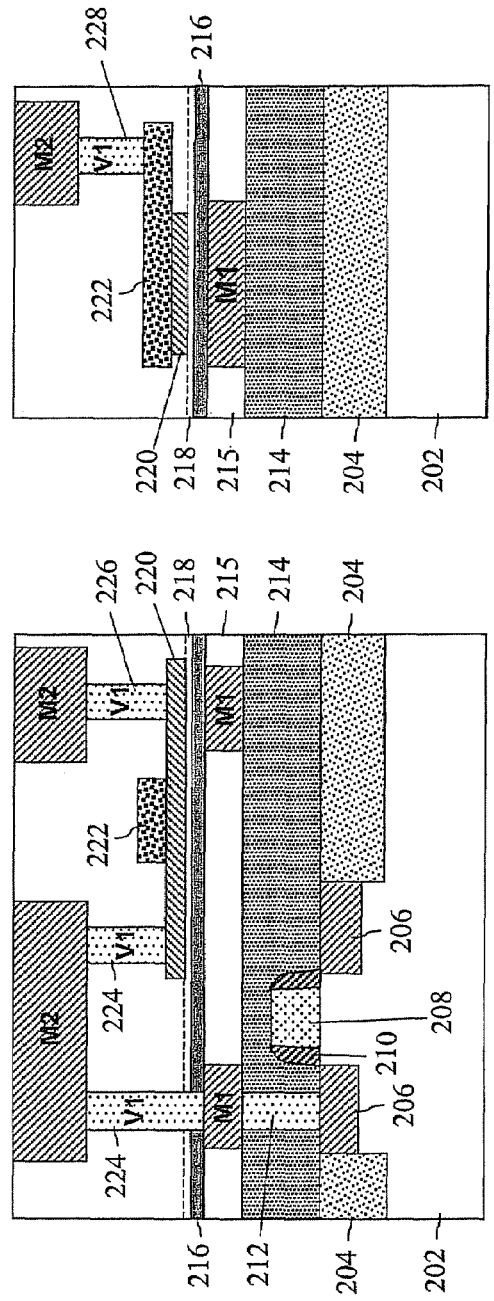
Fig. 2(a)
Fig. 2(b)
Fig. 2(c)

Resistances for $w = 40$ nm, 2 materials A, B

| | $A_{ON}$ | $A_{OFF}$ | $B_{ON}$ | $B_{OFF}$ |
|---|---|---|---|---|
| $L, h$ (nm) | 80, 40 | 40, 20 | 80, 40 | 40, 20 |
| $\rho$ ($\Omega$ cm) | $1 \times 10^{-2}$ | $1 \times 10^3$ | $0.5 \times 10^{-3}$ | 1 |
| $R$ ($\Omega$) | $5 \times 10^3$ | $5.0 \times 10^8$ | $2.5 \times 10^2$ | $5.0 \times 10^5$ |

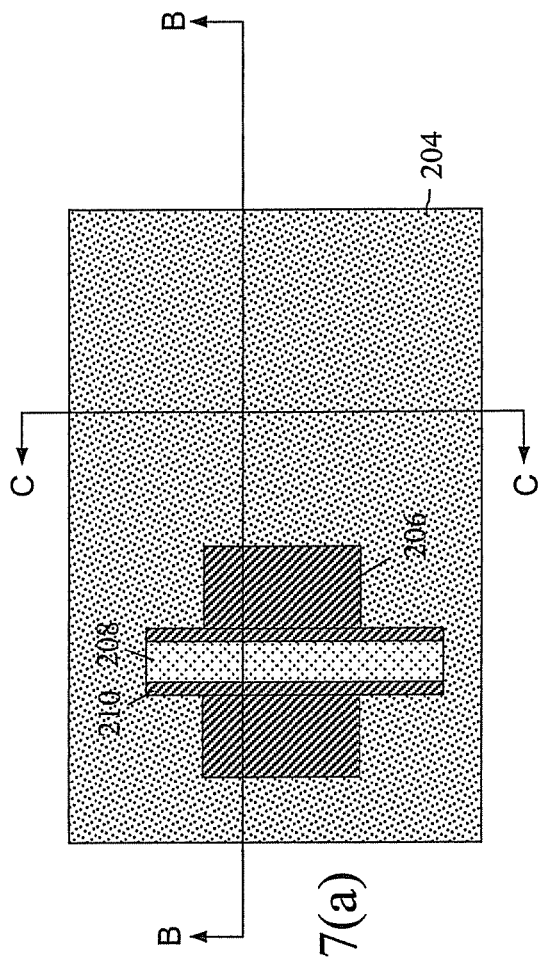
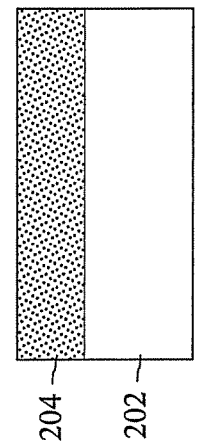
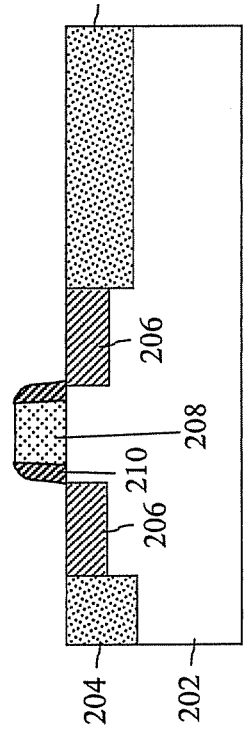
Fig. 7(a)
Fig. 7(b)
Fig. 7(c)

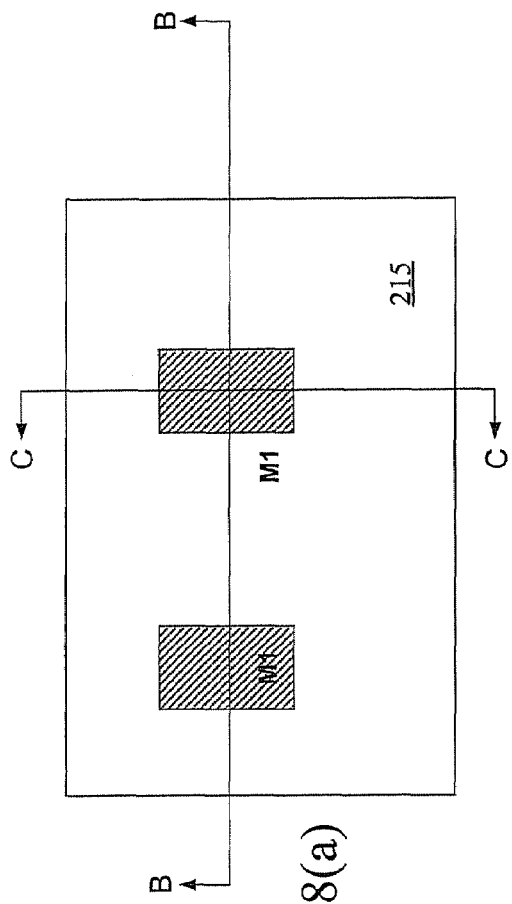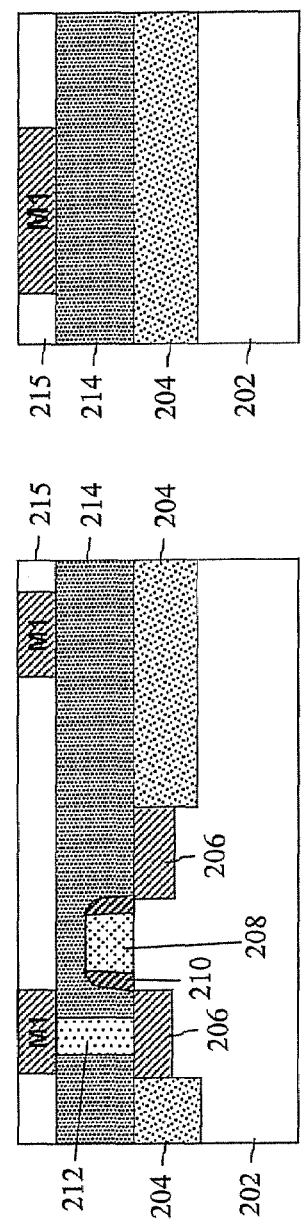

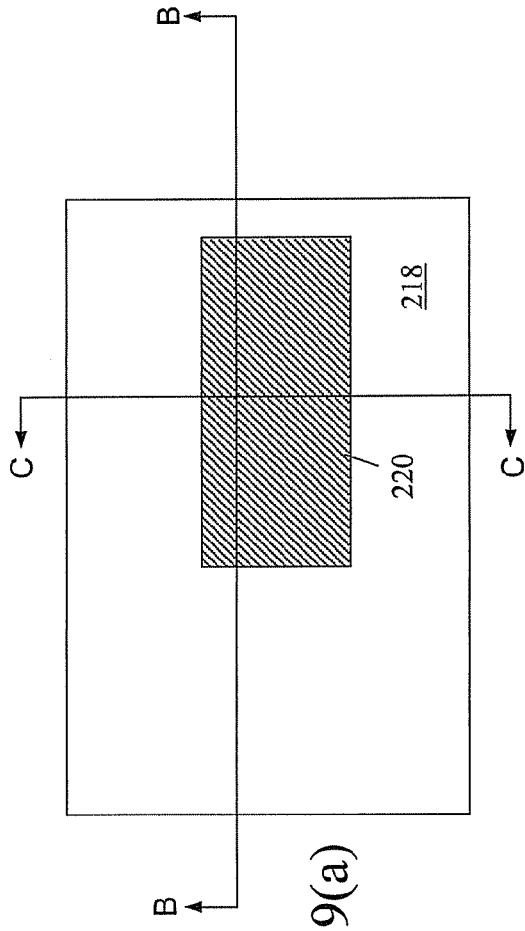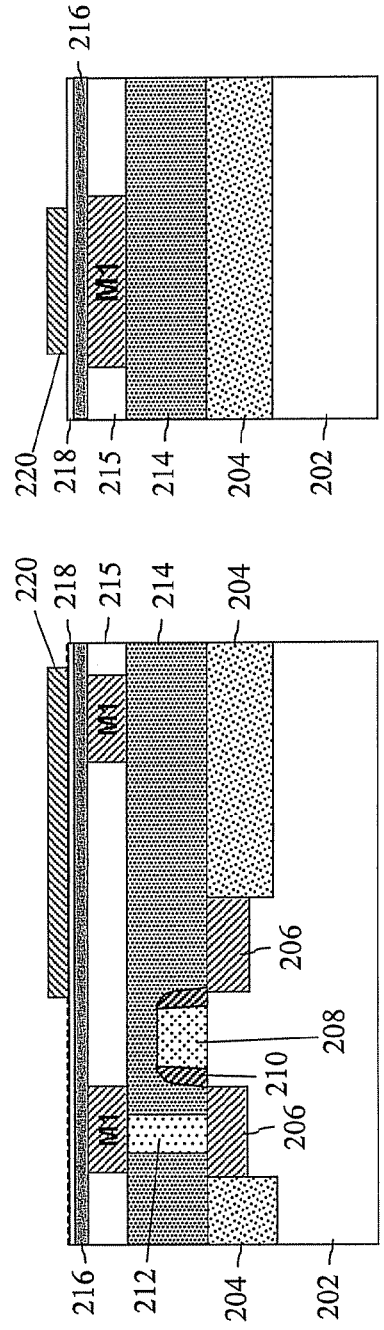
Fig. 9(a)
Fig. 9(b)
Fig. 9(c)

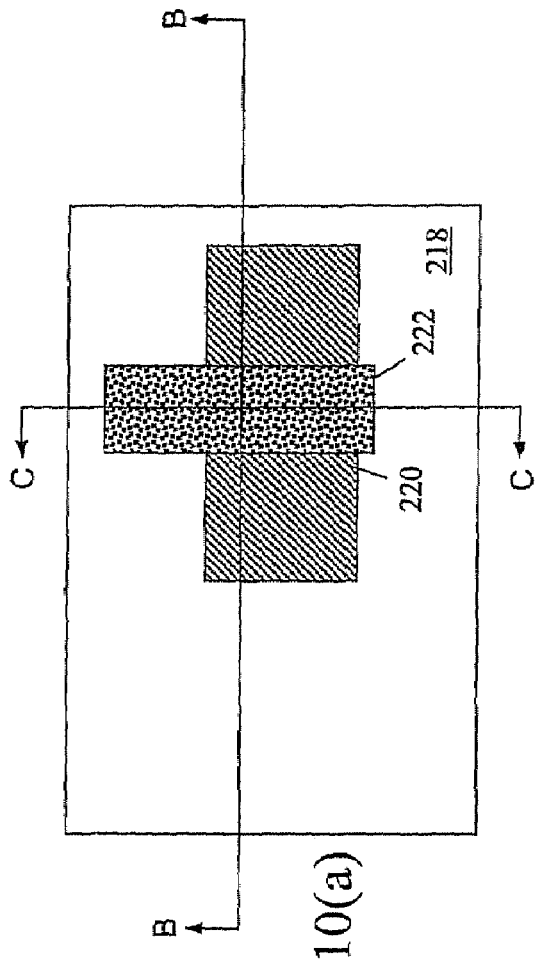
Fig. 10(a)
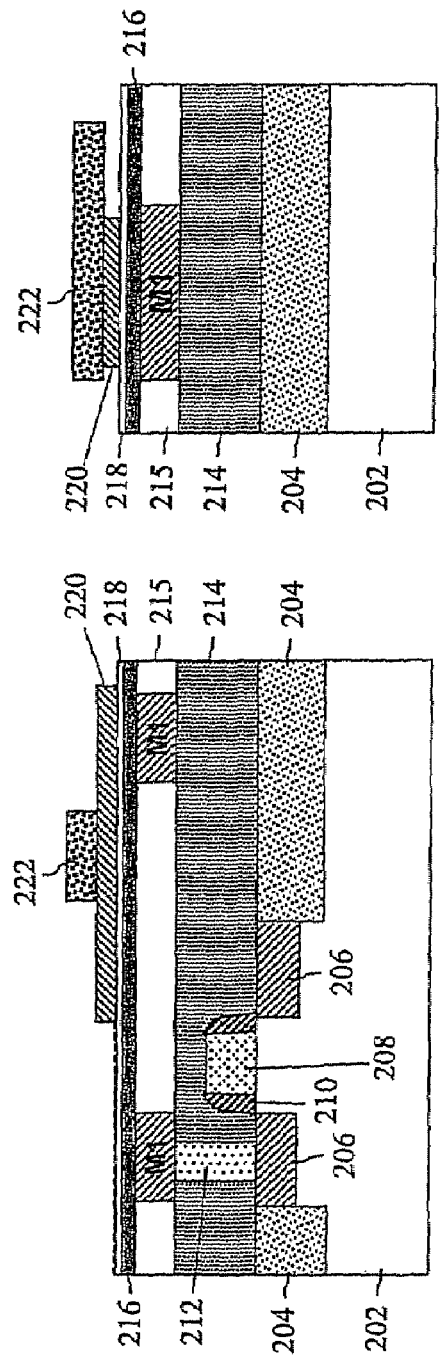
Fig. 10(b)
Fig. 10(c)

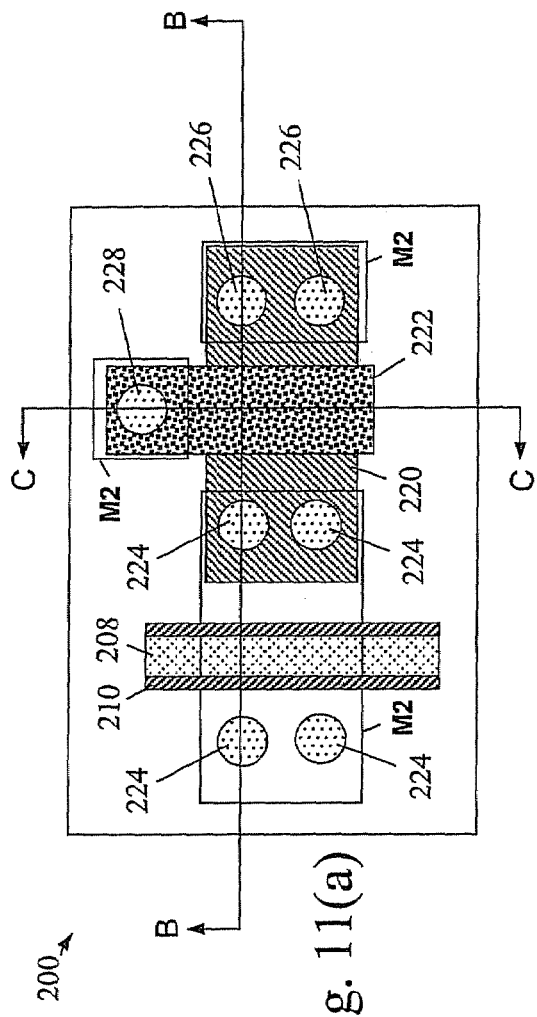
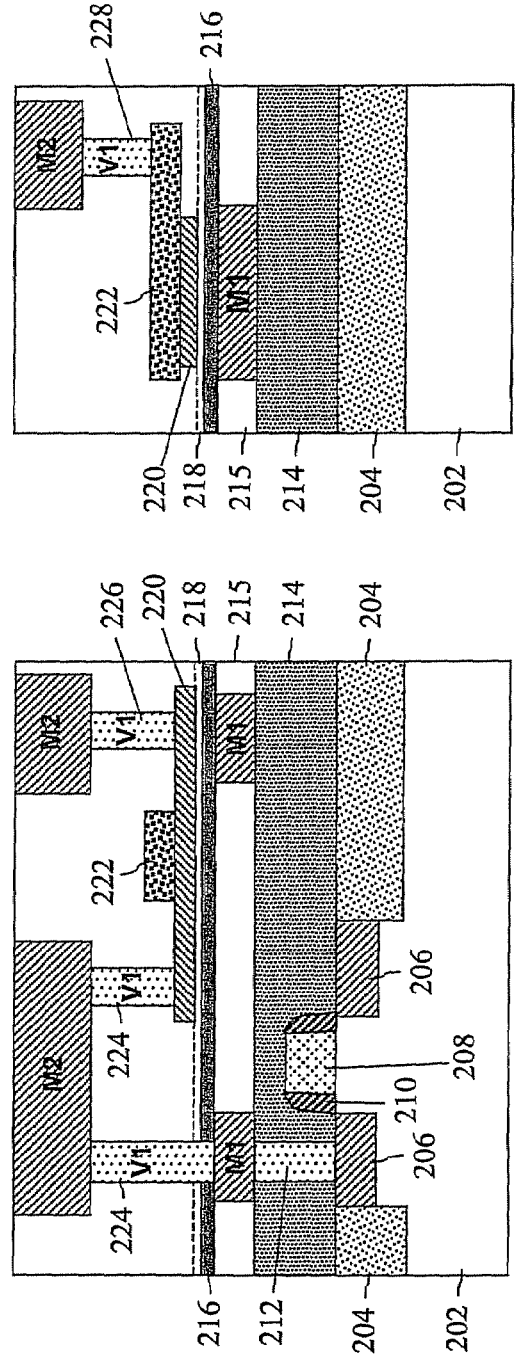
Fig. 11(a)
Fig. 11(b)
Fig. 11(c)

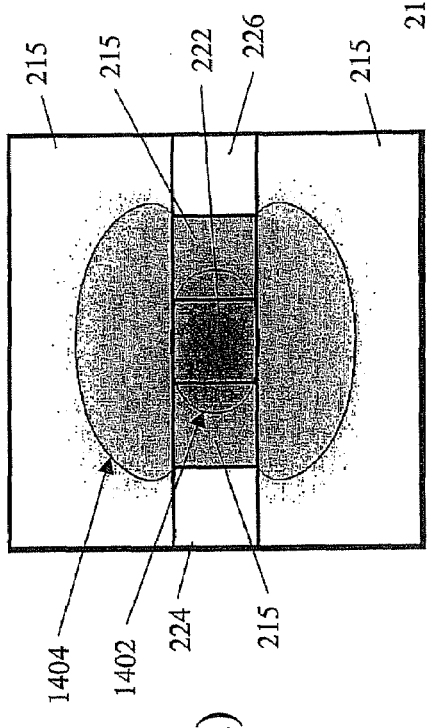
Fig. 14(a)
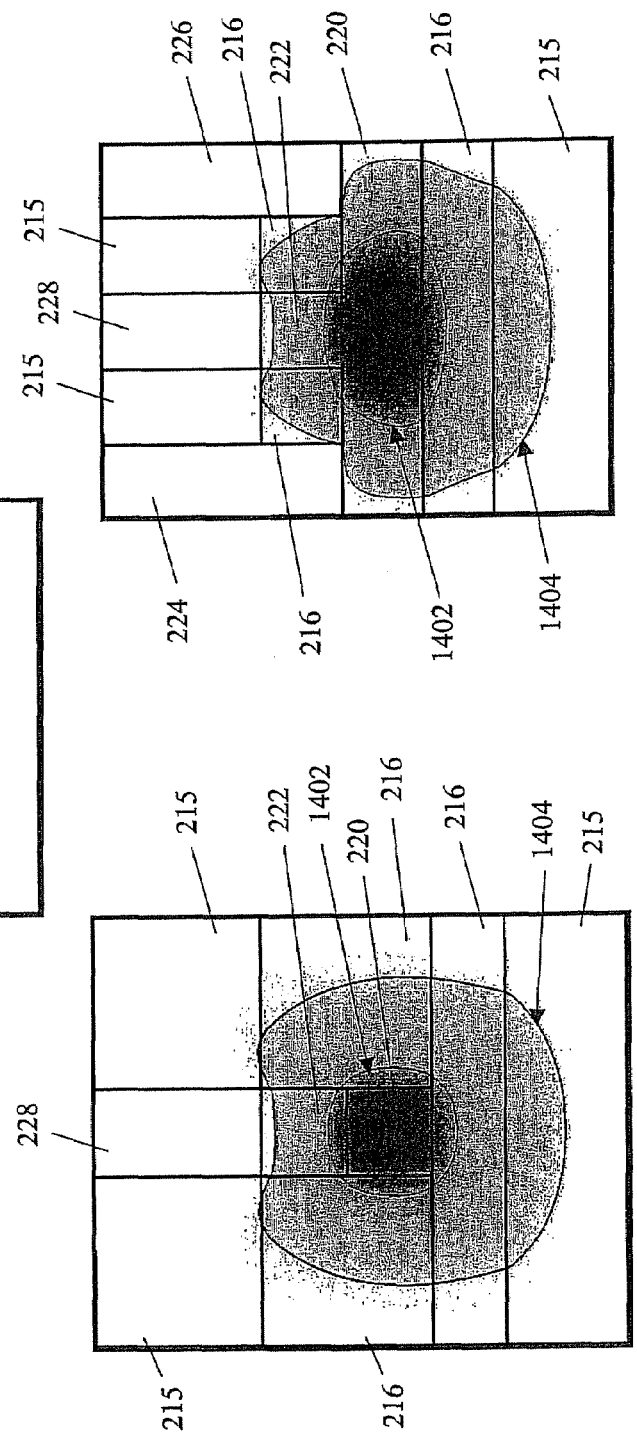
Fig. 14(b)
Fig. 14(c)

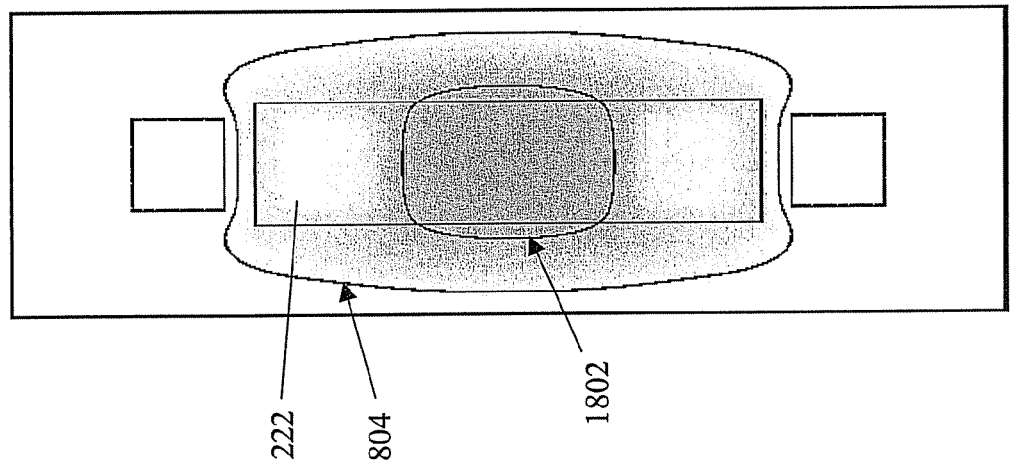
Fig. 18(c)
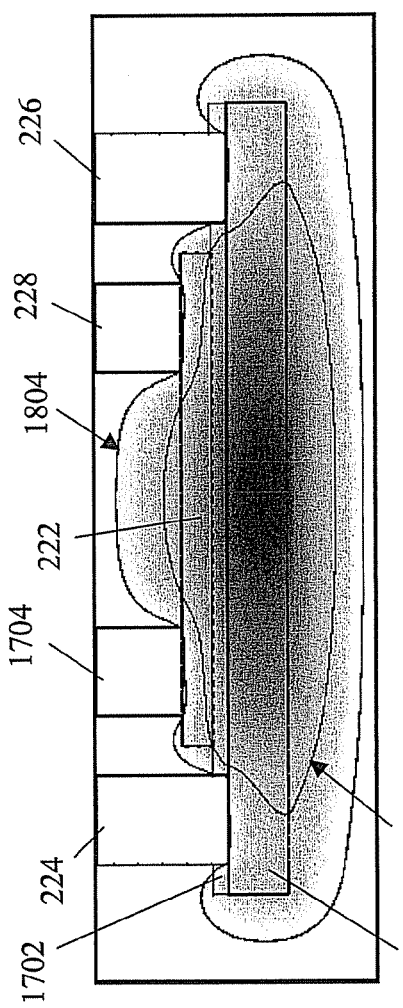
Fig. 18(a)
Fig. 18(b)

PROGRAMMABLE FUSE/NON-VOLATILE MEMORY STRUCTURES IN BEOL REGIONS USING EXTERNALLY HEATED PHASE CHANGE MATERIAL

BACKGROUND

The present invention relates generally to integrated circuit devices and, more particularly, to programmable fuse/non-volatile memory structures (and arrays) using externally heated phase change material.

Electrically programmable fuse (eFUSE) devices have many practical applications such as, for example, redundancy implementation in memory arrays, field programmable arrays, voltage trimming resistors/capacitors, RF circuit tuning, electronic chip identification, usage tracking/diagnostic data logging, remote disabling of a device/car that is reported stolen, read only memory (ROM), etc. Existing eFUSE technology is based on various different techniques such as, for example, electromigration (IBM), rupture (Infineon) and agglomeration (Intel). However, each of these existing fuse technologies are "one-shot," in that once the fuse is blown, it cannot be returned to a conducting state. Moreover, such devices occupy relatively large areas, involve large amounts of power/current, and are very slow to program (e.g., several microseconds).

On the other hand, reprogrammable fuses utilizing chalcogenide materials (and indirect heating through a resistive heater) are described in U.S. Pat. No. 6,448,576 to Davis et al. However, such chalcogenide fuse materials emit large amounts of heat, and it is estimated that switching currents needed to produce the required programming heat are on the order of about 15 mA. Under this assumption, a required heater current of 15 mA would in turn result in a design that is inconveniently large, requiring a driver FET width on the order of about 15 microns.

Accordingly, as eFUSE technology develops, it will be desirable to be able to address existing concerns pertaining to higher performance, including factors such as: reducing the device area taken up by the fuse, cope with the "sunsetting" of the non-standard high voltages/currents required by existing programmable fuse devices, the desirability of having multi-shot reprogrammable fuses, and enhanced speed, among other aspects. In addition to the general improvement of eFUSE technology, there is also the issue of contamination susceptibility of the substrate (e.g., silicon) material from the materials used in eFUSE technology, as well as effects on temperature sensitive insulating materials (e.g., low-K SiCOH) in the integrated circuit device.

SUMMARY

The foregoing discussed drawbacks and deficiencies of the prior art are overcome or alleviated by a programmable phase change material (PCM) structure. In an exemplary embodiment, the structure includes a heater element formed at a back end of line (BEOL) level of a semiconductor device, the BEOL level including a low-K dielectric material therein; a first via in electrical contact with a first end of the heater element and a second via in electrical contact with a second end of the heater element, thereby defining a programming current path which passes through the first via, the heater element, and the second via; a PCM element disposed above the heater element, wherein the PCM element is configured to be programmed between a lower resistance crystalline state and a higher resistance amorphous state through the use of SET and RESET programming currents through the heater element; and a third via in electrical contact with the PCM element, thereby defining a sense current path which passes through the third via, the PCM element, the heater element, and the second via, wherein the sense current path is used to detect the programmed resistance state of the PCM element.

In another embodiment, a non-volatile, programmable phase change material (PCM) memory array includes a plurality of memory cells arranged in rows and columns, with each memory cell comprising a heater element formed at a back end of line (BEOL) level of a semiconductor device, the BEOL level including a low-K dielectric material therein; a first via in electrical contact with a first end of the heater element and a second via in electrical contact with a second end of the heater element, thereby defining a programming current path which passes through the first via, the heater element, and the second via; a PCM element disposed above the heater element, wherein the PCM element is configured to be programmed between a lower resistance crystalline state and a higher resistance amorphous state through the use of SET and RESET programming currents through the heater element; and a third via in electrical contact with the PCM element, thereby defining a sense current path which passes through the third via, the PCM element, the heater element, and the second via, wherein the sense current path is used to detect the programmed resistance state of the PCM element; and sensing circuitry configured to sense the resistance of the PCM element.

In still another embodiment, a method of forming a programmable phase change material (PCM) structure includes forming a heater element at a back end of line (BEOL) level of a semiconductor device, the BEOL level including a low-K dielectric material therein; forming a first via in electrical contact with a first end of the heater element and a second via in electrical contact with a second end of the heater element, thereby defining a programming current path which passes through the first via, the heater element, and the second via; forming a PCM element above the heater element, wherein the PCM element is configured to be programmed between a lower resistance crystalline state and a higher resistance amorphous state through the use of SET and RESET programming currents through the heater element; and forming a third via in electrical contact with the PCM element, thereby defining a sense current path which passes through the third via, the PCM element, the heater element, and the second via, wherein the sense current path is used to detect the programmed resistance state of the PCM element.

BRIEF DESCRIPTION OF THE DRAWINGS

Referring to the exemplary drawings wherein like elements are numbered alike in the several Figures:

FIGS. 2(a) through 2(c) are top and cross-sectional views of a programmable eFUSE device using an externally heated PCM, and which is formed at a BEOL level of device processing, in accordance with an embodiment of the invention;

FIGS. 7 through 11 are top and cross-sectional views illustrating a more detailed, sequential description of an exemplary method of forming the device of FIG. 2;

FIGS. 14(a) through 14(c) illustrate temperature contours resulting from a PCM heating simulation of a device similar to the embodiment of FIGS. 12 and 13;

FIGS. 18(a) through 18(c) illustrate temperature contours resulting from a PCM heating simulation of a device similar to the embodiment of FIGS. 17(a) and 17(b).

DETAILED DESCRIPTION

Figure 1:
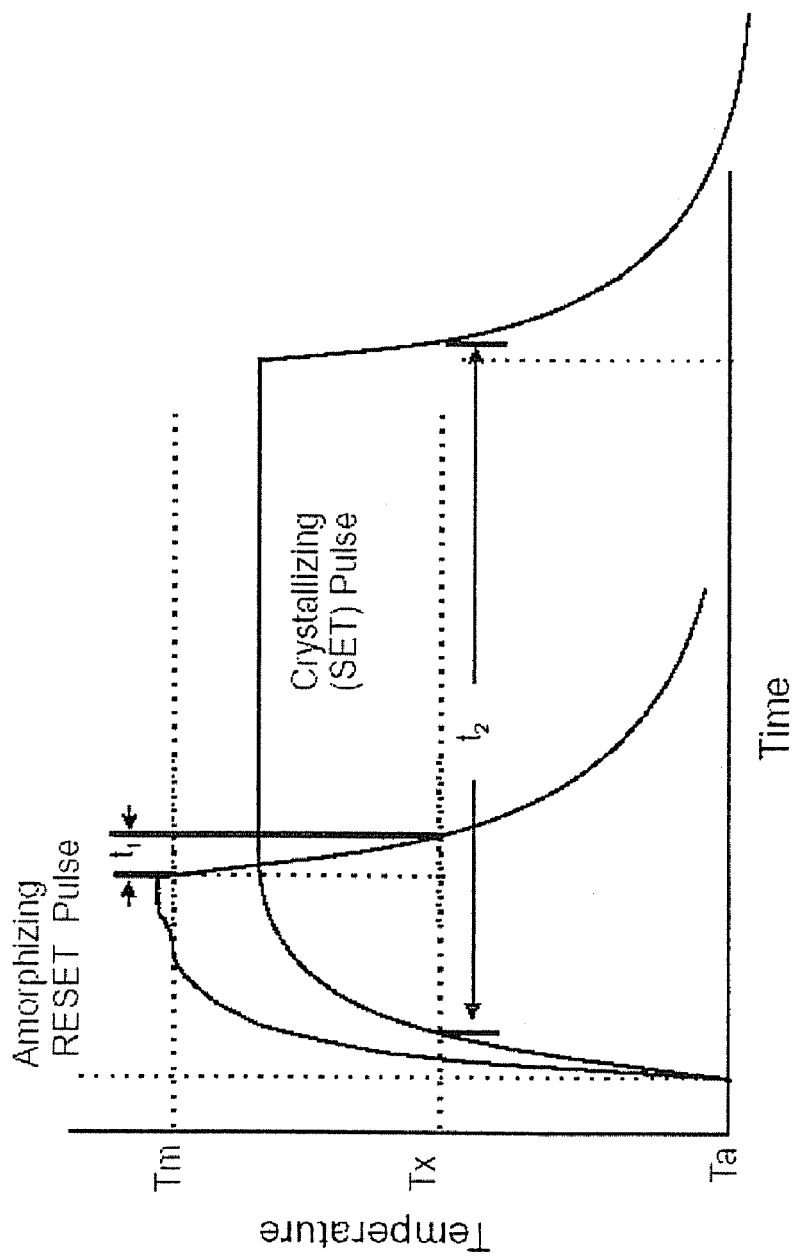
FIG. 1 is a graph illustrating the exemplary thermal cycling operations of a phase change material.

Disclosed herein are electrically reprogrammable fuse (eFUSE) devices and non-volatile memory structures such as Phase Change Random Access Memory ("PCRAM" also referred to as "PRAM"), as well as arrays thereof using externally heated, phase change material. Such devices may be advantageously integrated at a back-end-of-line (BEOL) region of device formation, thereby involving minimal changes to standard CMOS processing technology. As certain PCMs may be undesirable at the silicon fabrication level due to contamination sensitivity, a BEOL location is more process-compatible. Accordingly, embodiments described herein incorporate a PCM-based eFUSE design for the low temperature region of the logic chip. This region is manufactured at the BEOL, in a low temperature environment, in oxide-based chip locations that are far removed from the silicon. A design of this type is desirable to avoid diffusion and contamination of PCM components (e.g. tellurium) into silicon.

As more particularly described hereinafter, the disclosed invention embodiments adopt the solution of location at the lower BEOL levels of an integrated circuit device. For instance, a PCM device utilizes the existing "K1" (BEOL level) resistor in CMOS devices (e.g., TaN resistor technology) as an external heater element. In addition, the PCM material is kept at a relative far distance from the transistor (as GST may affect the transistor adversely). Moreover, minimal process changes to standard CMOS BEOL processing result, with only PCM deposition and patterning added to the processing.

Three exemplary embodiments are presented herein in the form of three-terminal devices. The BEOL location, desirable to avoid contamination of the silicon structures by PCM, does introduce the possibility of damage to the low-K material (e.g. SiCOH) by the high temperatures reached during thermal cycling operations. Accordingly, one or more of the exemplary embodiments presented herein include designs which eliminate this problem.

Phase Change Materials

Certain phase change materials (such as Ge—Sb—Te (GST) alloys) have a programmable electrical resistance that changes with temperature. Other compositions such as $GeSb_4$ and more generally $Ge_xSb_y$, (including substitution/addition of other elements) are also possible for the phase change materials. Individual phase change elements (PCE) are thus used as programmable eFUSEs or as the storage cells of a memory device. The state of an individual PCE is programmed through a heating and cooling process which is electrically controlled by passing a current through the PCE (or a discrete heating element in proximity to the PCE) and the resulting ohmic heating that occurs. Depending upon the specific applied temperature and duration of heating applied to the PCE element, the structure is either "set" to a lower resistance crystalline state or "reset" to an amorphous, higher resistance state. Essentially, there is no practical limit to the number of times a PCE may be programmed from the crystalline state to the amorphous state and vice versa.

The changing of the phase of a PCE typically requires a high temperature (e.g., considerably above the PCM melting temperature of about 600° C.), as can be obtained by Joule heating from current flowing through the phase change material or discrete resistor. When the phase change material is heated above its melting temperature to thereafter be quickly cooled, the phase change material becomes amorphous to result in a severed electrical connection in the case of an eFUSE, or to store a data bit of one logical value in the case of a memory element. Alternatively, when the phase change material is heated above its crystallization temperature and maintained at that temperature for a predetermined time before cooling, the phase change material becomes crystalline to result in a restored electrical connection in the case of an eFUSE, or to store a data bit of the opposite logical value in the case of a memory element.

More specifically, FIG. 1 is a graph illustrating the exemplary thermal cycling operations of a phase change material. As is illustrated, a first thermal cycling operation includes a "RESET" pulse for converting the PCM from crystalline to amorphous form, and a second thermal cycling operation includes a "SET" pulse for converting the PCM from amorphous to crystalline form. During the RESET pulse, the temperature of the PCM is raised above its melting temperature ($T_m$), followed by a rapid quench over a short time $t_1$. As a result of the rapid quench, the disordered arrangement of atoms of the PCM due to the melt is retained. Thus, the PCM is left in an amorphous, high resistive state after the RESET pulse. During the SET pulse, the PCM is annealed at a lower temperature with respect to the melting temperature, and for a longer time $t_2$ with respect to $t_1$. This process enables the amorphous form to crystallize into a lower resistive state.

From a practical standpoint, some of the design requirements for a PCM-based eFUSE or non-volatile memory device include the capability of functionally perform the SET and RESET operations for a very large number of cycles (e.g., on the order of about $10^{11}$), the capability of reading/sensing the state of the fuse/memory element, the limitation on the amount of power/current needed to program the PCM, and the need to minimize the cost and time requirements to implement the structure with minimal changes to standard CMOS processing.

First Exemplary Embodiment

Referring now to FIGS. 2(a) through 2(c), there are shown various top and cross-sectional views of a programmable eFUSE device 200 using an externally heated PCM, and which is formed at a BEOL level of device processing, in accordance with an embodiment of the invention. In the exemplary single-cell implementation depicted, formation of the eFUSE structure results in exposure of low-K insulating material (e.g., SiCOH) to the heater. Accordingly, this design may be more suitable for a single (or perhaps several) shot eFUSE, as opposed to memory applications that implement a large number of cycles, as in memory applications. In a single-cell implementation, the device 200 utilizes a standard CMOS transistor at the silicon or substrate level as the driver for the heater.

More specifically, FIG. 2(a) is a top view of a programmable eFUSE structure 200, FIG. 2(b) is a cross-sectional view taken along B-B of FIG. 2(a), and FIG. 2(c) is a cross-sectional view taken along C-C of FIG. 2(a). As particularly illustrated in the cross-sectional views of FIGS. 2(b) and 2(c), a substrate 202 (e.g., silicon, silicon-on-insulator, etc.) has an insulating layer (e.g., shallow trench isolation) 204 formed therein. As known in the art, a CMOS transistor includes source/drain diffusion regions 206 formed in the substrate, as well as a gate electrode 208 formed over the substrate 202 (and upon a gate insulating layer (e.g., an oxide), not shown), and sidewall spacers 210. It should be noted that in the top view of FIG. 2(a), the gate electrode 208 and sidewall spacers 210 (being formed at the substrate level) would not be visible from a BEOL level of processing. However, the relative position of the gate electrode 208 and sidewall spacers 210 with respect to the BEOL region is also shown for illustrative purposes in FIG. 2(a).

A contact area (CA) stud 212 is used to provide electrical contact between one of the source/drain diffusion regions 206 of the transistor and a first level of metal interconnect, commonly referred to in the art as M1. The CA stud 212 is formed within a first inter-level dielectric (ILD) layer 214, which may also be known as middle-of-line (MOL) dielectric layer. The MOL dielectric layer 214 may be a material such as an oxide, or could alternatively be a low-K dielectric layer. However, as shown in FIGS. 2(b) and 2(c), the M1 metal wiring layer is formed within a low-K dielectric material 215, such as SiCOH, for example.

Disposed above the M1 level of metal is an etch stop layer 216 (e.g., N-BLoK), followed by a thin layer 218 (e.g., about 300 Å) of low-K dielectric material and a thin layer (e.g., about 300 Å) of resistive heater material such as tantalum nitride (TaN), for example, which is patterned to create a PCM heater element 220. Then, a PCM material such as GST (GeSbTe) or GeSb is deposited and patterned for use as a PCM NVM (phase change material non-volatile memory) element 222. Once formed, additional low-K dielectric material may then be formed in preparation of via (V1) and next level metal (M2) damascene processing. As further shown in FIGS. 2(a) through 2(c), a first set of V1 level vias 224 (through the M2 level of wiring) connects the transistor source or drain 206 to one end of the TaN heater element 220. The PCM element 222 is in close thermal coupling to, and electrically connected with, the heater element 220, wherein the PCM element 222 forms a bar on top of the heater 220 (as best seen in FIG. 2(a), and transverse thereto. Thus, both heater 220 and PCM 222 are disposed between the M1 and M2 levels of the device in a low-K SiCOH environment, the SiCOH providing both electrical and thermal insulation.

As is further illustrated in FIGS. 2(a) and 2(b), the opposite end of the heater element 220 with respect to the transistor source/drain connection is connected to the programming circuitry (not shown) through a second set V1 level vias 226. In addition, as best seen in FIGS. 2(a) and 2(c), the end of the PCM bar 222 remote from the heater 220 is connected to the M2 level (and sense circuitry, not shown) with still another V1 level via 228. Sequential processing views illustrating the formation steps of structure 200 of FIGS. 2(a) through 2(c) in further detail, as well as exemplary processing conditions, are presented hereinafter.

Electrical Operation

Figures 3A, 3B:
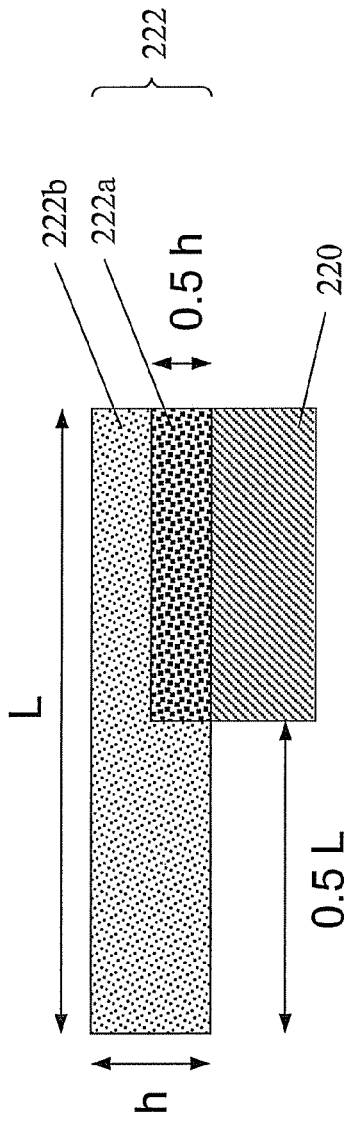
FIG. 3(a) is a schematic diagram of an impedance model for a PCM pad having a constant resistance portion and a transformable, variable resistance portion.
FIG. 3(b) is a table illustrating exemplary ON/OFF resistances for a pair of different PCM materials used for the PCM pad of FIG. 3(a)

Referring now to FIGS. 3(a) and 3(b), estimates of the PCM impedances for ON and OFF states are illustrated, on the basis of a pair of assumptions about PCM dimensions, and a pair of assumptions about the PCM material, which comprises a high resistivity material (A), and a low resistivity material (B). In particular, FIG. 3(a) depicts an impedance model for a PCM pad 222 having a length L, a width w (not shown in FIG. 3(a)), and a height h. The PCM pad 222 is disposed on a heater element 220 such that a first portion 222a of the PCM pad 222 is contact with the heater element 220 and a second portion 222b of the PCM pad 222 is not in contact with the heater element 220. As a result of a relative lack of heating, portion 222a has a substantially constant resistance, R. On the other hand, transformable portion 222b, which in the exemplary embodiment depicted represents a portion of about ½ L×w×½ h, has a variable resistance. The table in FIG. 3(b) further illustrates exemplary ON/OFF resistances for a pair of different PCM materials A, B (e.g., $Ge_2Sb_2Te_5$, $GeSb_4$, respectively).

Figure 4:
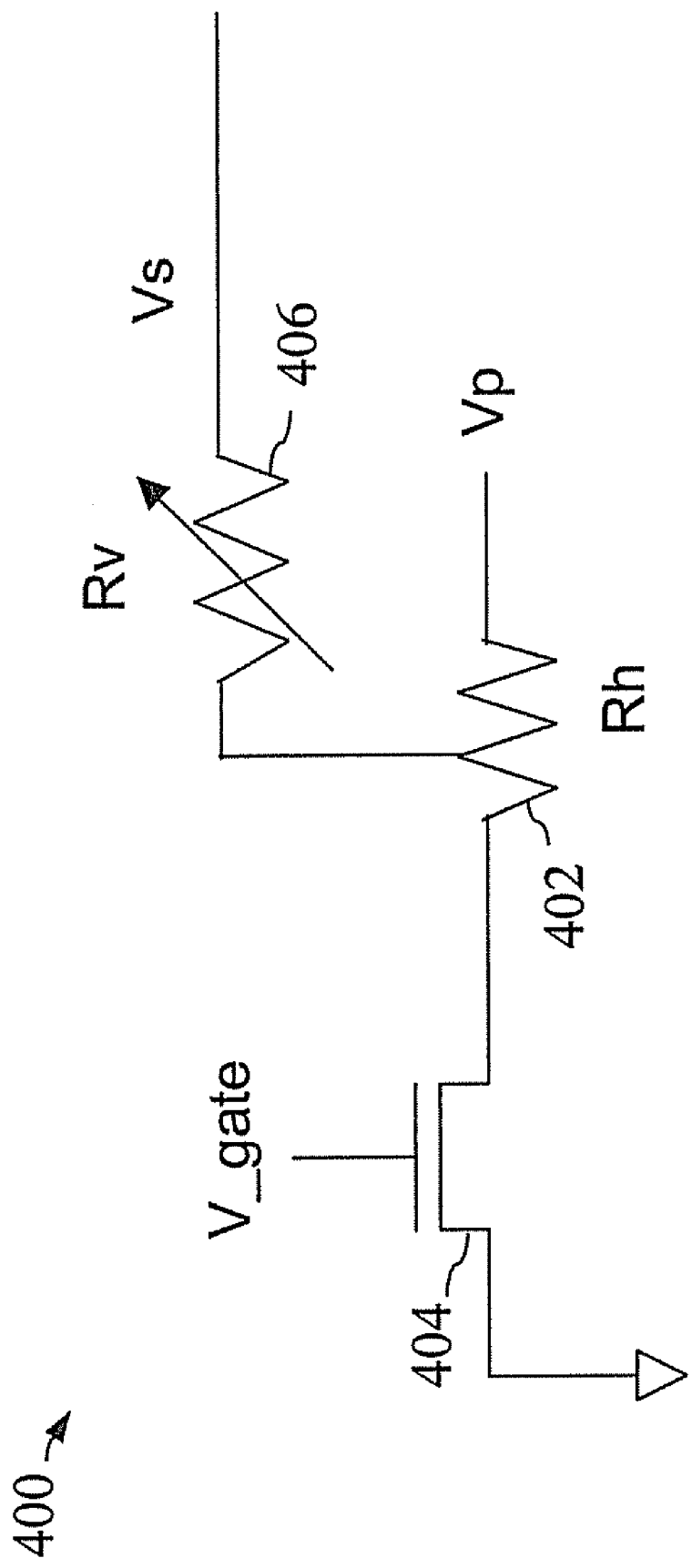
FIG. 4 is a schematic diagram illustrating the operation of a PCM non-volatile memory cell, such as fabricated in accordance with FIGS. 2(a) through 2(c)

FIG. 4 is a schematic diagram illustrating the operation (both programming and sensing) of a single PCM non-volatile memory cell 400, such as one fabricated in accordance with FIGS. 2(a) through 2(c). A heater element 402, having resistance Rh, is connected on one side to the source/drain of a drive transistor 404, with gate voltage V_gate, and on the other side to a programming voltage Vp. A PCM element 406, having a variable resistance Rv, is in electrical contact with (about) the center of the heater element 402 at one end thereof, with a sense voltage Vs coupled to the other end of the PCM element 406.

In order to SET the resistance of the PCM element 406 to a high state (e.g., a high resistance), the programming voltage Vp is set to a high voltage and V_gate is pulsed, for a relatively short time at relatively high current (e.g., as depicted in FIG. 1). In so doing, a high level of current flows through the heater element 402 (e.g., TaN) and raises the temperature of the PCM element 406 to a high temperature. Once the gate pulse ends, the PCM element 406 becomes amorphous and assumes a high resistance. Conversely, in order to RESET the resistance of the PCM element to a low state (e.g., a low resistance), the programming voltage Vp is set to a non-zero low voltage and V_gate is pulsed for a relatively long time at relatively low current (e.g., as depicted in FIG. 1). In so doing, a low level of current flows through the heater element 402 and raises the temperature of the PCM element 406 to a medium temperature. Once the gate pulse ends, the PCM element 406 becomes crystalline and assumes low resistance.

In order to sense the resistance state of the PCM element 406, a non-zero voltage is applied to Vs (the sense terminal) and V_gate of the drive transistor 404 is then pulsed. The amount of current passing through the PCM element 406 is dependent on the state (i.e., the resistance value) thereof.

Figure 5A:
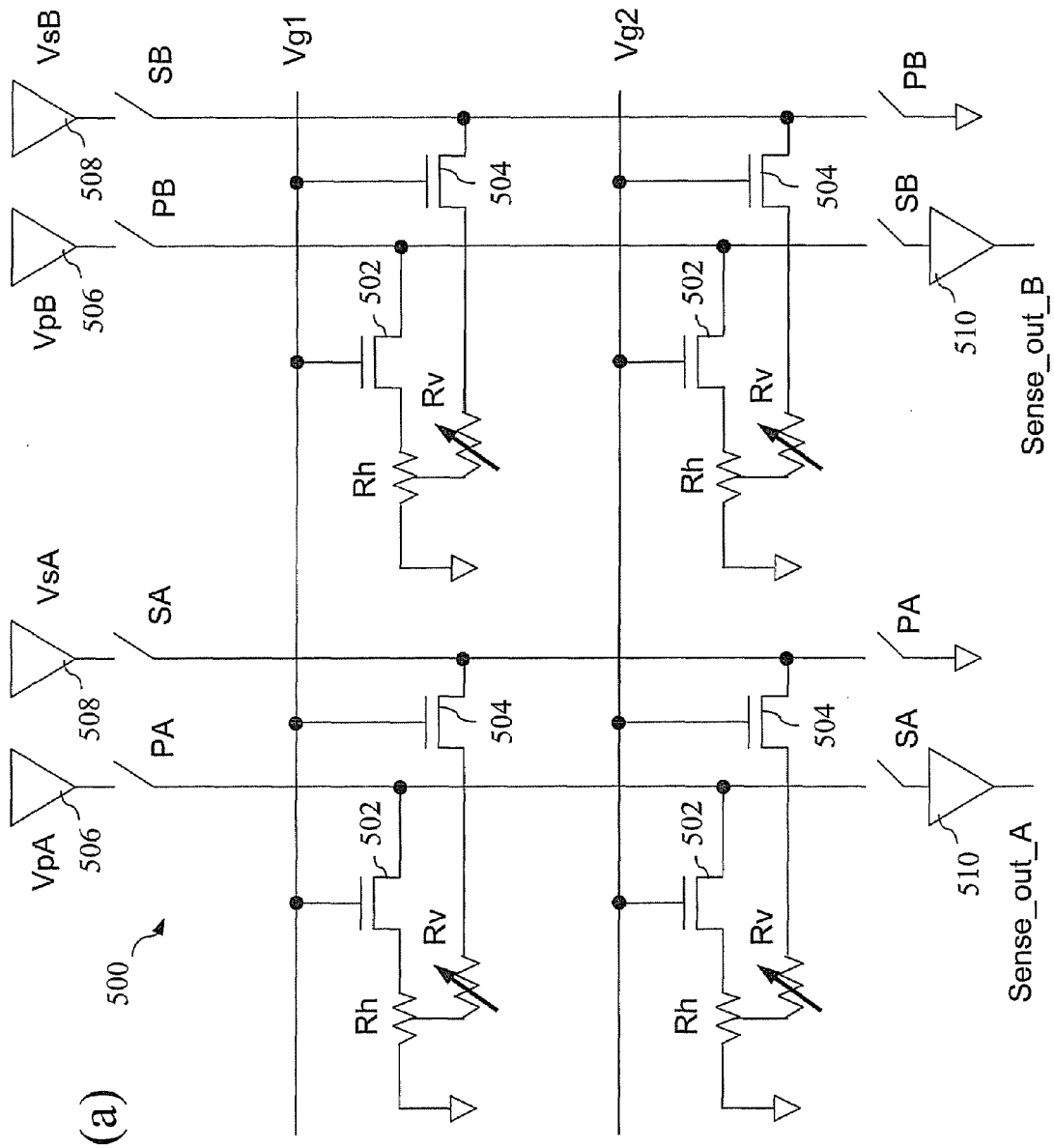
FIG. 5(a) is a schematic diagram illustrating an array of non-volatile memory cells using an externally heated PCM and associated sensing circuitry, in accordance with a further embodiment of the invention.
Figure 5B:
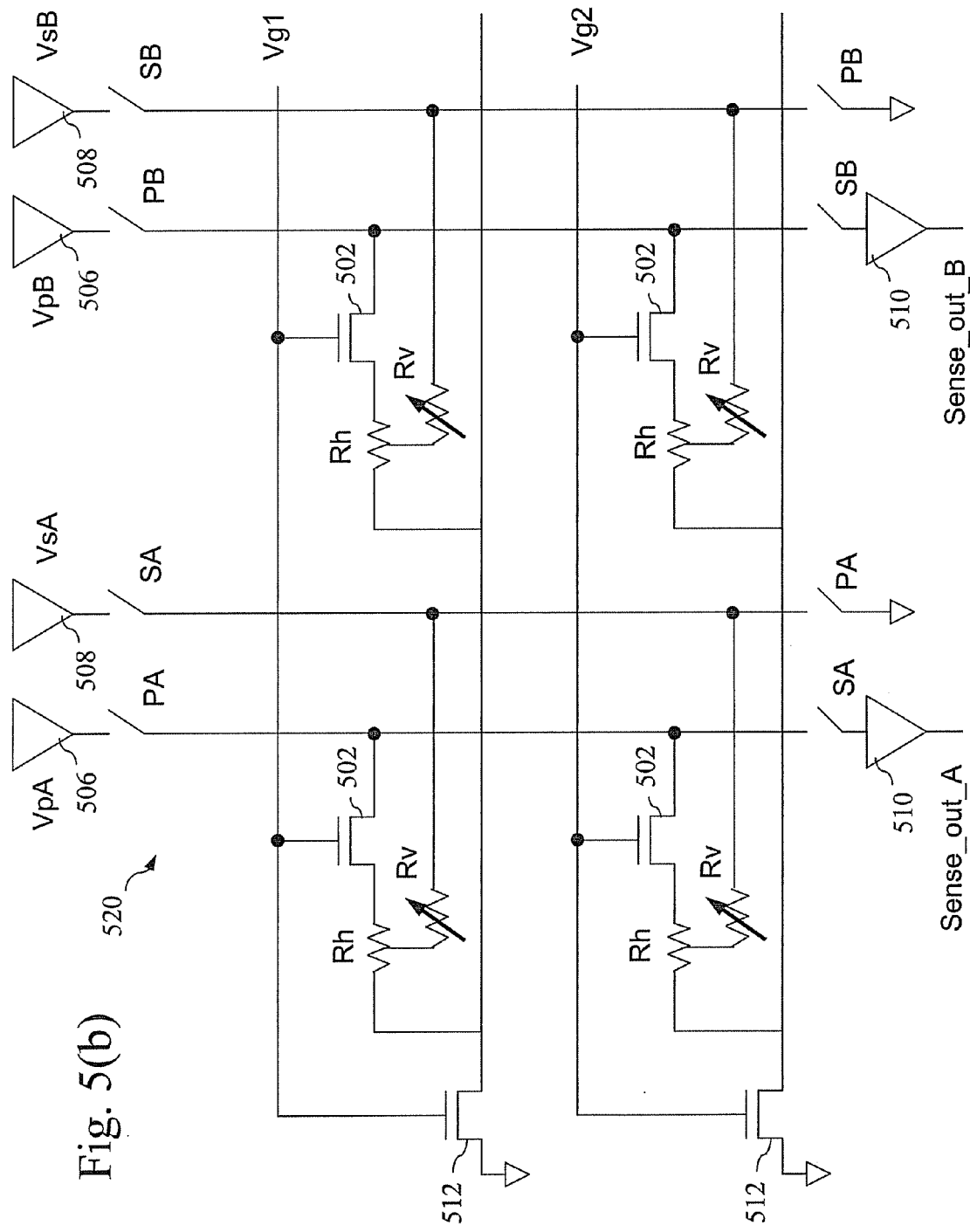
FIGS. 5(b) and 5(c) are alternative embodiments of the sensing circuitry for an array of non-volatile memory cells.
Figure 5C:
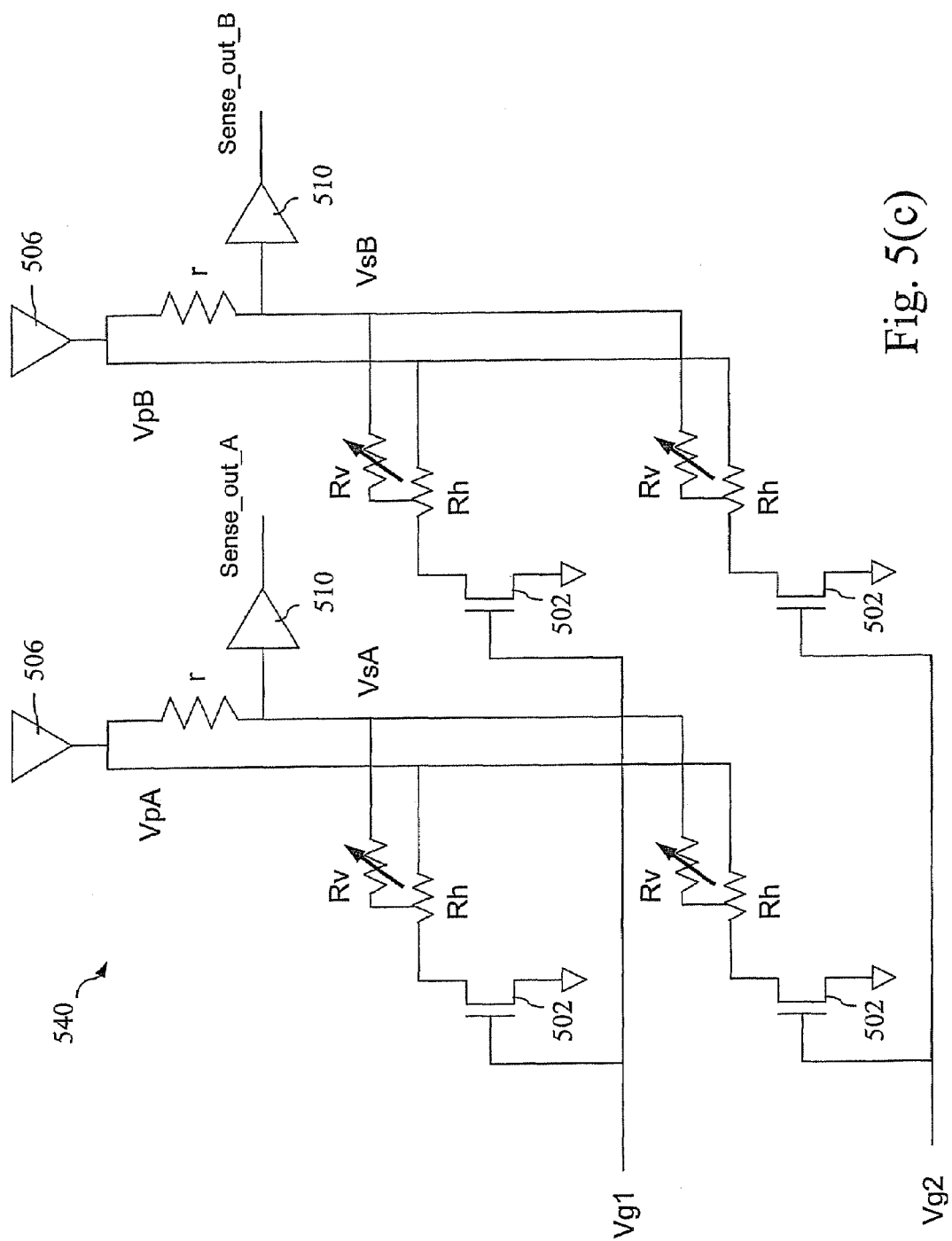

Referring generally to FIGS. 5(a) through 5(c), various embodiments of sensing circuitry for an array of PCM memory cells such as shown in FIGS. 2(a) through 2(c) and FIG. 4 are depicted. For purposes of simplicity, the arrays are depicted as 2×2; however, it will be appreciated that the principles described herein are applicable to larger arrays.

FIG. 5(a) illustrates an exemplary sense array circuit 500. In addition to the programming transistors 502, each cell includes an additional sense transistor 504 configured to pass a lower current with respect to the programming transistor 502. This configuration prevents current from circulating between the program lines (PA, PB, etc.) and the sense lines (SA, SB, etc.) through non-selected cells in a given column. As also shown in FIG. 5(a), an adjustable power supply 506 (VpA, VpB, etc.), and a fixed power supply 508 (VsA, VsB, etc.) is provided for each column, as is a sense current amplifier 510. These devices are connected to the column lines by switches PA, PB, etc., and SA, SB, etc. It will be noted that, for any of the sense circuit embodiments, the power supplies (e.g., both the adjustable and fixed power supplies 506, 508) may be located on the same circuit board as the sense array circuit 500, or they may be located on a different component altogether. In the latter instance, the off-chip sources would be coupled to corresponding power source nodes on the chip containing the sense array circuit 500.

In order to program a cell (for example, in column A) the PA switches are closed and the SA switches are opened. A programming (high) voltage is thus applied by the adjustable power supply 506 to the appropriate Vp line connected to the cell, and the gate line (e.g., Vg1, Vg2, etc.) corresponding to the cell to be programmed is pulsed. The magnitude and duration of the pulse is selected between one having a low magnitude and slow ramp down (e.g., low resistance for writing a logical 0) and one having a large magnitude and fast ramp down (e.g., high resistance for writing a logical 1). Optionally, programming can be done for all 0's or all 1's on the same gate line at the same time.

To sense (read) a cell in column A, for example, the PA switches are opened and the SA switches are closed. A sensing (low) voltage, below the programming threshold, is then applied to the sense line VsA, and the gate line (e.g., Vg1, Vg2, etc.) corresponding to the cell to be sensed is pulsed. A parallel output of all cells attached to the selected gate line is coupled to the corresponding current sense output 510, thus generating, for example, Sense_out_A in column A.

FIG. 5(b) illustrates an alternative embodiment 520 of the sense array circuit of FIG. 5(a), wherein the sense transistors 504 in each cell are instead replaced by a common transistor 512 for each row (gate line) in the peripheral circuitry. The operations for programming/sensing a single cell are the same as described in FIG. 5(a). It will be noted that in the FIG. 5(b) design, it may not be practical to simultaneously sense or program large numbers of cells in a selected row if the common transistor 512 has to be too large.

FIG. 5(c) illustrates still another embodiment of the sense array circuit 540 in which the sense current passed through Rv is converted to a voltage through a small reference resistor "r" (wherein r is on the order of about 1-100Ω). The value of the reference resistor is kept very small; otherwise, it would be shunted by up to N (where N is the number of rows, e.g., 512) resistors (Rv+Rh/2) between the sense and programming lines. Shunting leads to an undesired dependence of the sense output on the state of the memory rather than just the state of the selected cell. Hence, r<(Rv+Rh/2)/N, where Rv is the resistance value of the PCM in the crystalline state. Because of the small value of r, the column sense amplifiers 510 are pulse voltage-amplifiers having a high gain of order N (e.g., on the order of about 1000); their design is facilitated by the low source resistance r. It will also be noted that a single adjustable power supply 506 (VpA, VpB, etc.) is provided per column. In this embodiment, significant current circulating between the program and sense lines in a given column in non-selected cells is prevented by the close proximity of the voltages of the programming and sense lines.

The array of FIG. 5(c) is programmed by application of a high voltage to the appropriate Vp line (A, B, etc.) connected to the cell, followed by pulsing the gate line for the cell. Again, the magnitude and duration of the pulse is selected between one having a low magnitude and slow ramp down (e.g., low resistance for writing a logical 0) and one having a large magnitude and fast ramp down (e.g., high resistance for writing a logical 1). Optionally, programming can be done for all 0's or all 1's on the same gate line at the same time. In order to sense the state of an array cell, a low voltage (below the programming threshold) is applied to the corresponding Vp line (A, B, etc.) connected to the cell, followed by pulsing the gate line for the cell. A parallel output of all cells attached to the selected gate line is coupled to the corresponding current sense output 510, thus generating, for example, Sense_out_A.

Notwithstanding the particular application of a PCM device as discussed above (e.g., reprogrammable eFUSE, non-volatile PRAM, etc.), certain key aspects of the operation of a PCM device include the quench time and the quench (RESET) power. For example, the quench time must be short (e.g., on a nanosecond time scale), in order for the melted PCM material cool to the amorphous state rather than recrystallizing. For GST ($Ge_2Sb_2Te_5$) material, recrystallization occurs by the relatively slow homogeneous nucleation process, facilitating amorphization. In other materials, heterogeneous recrystallization (i.e., re-invasion of the amorphous region by the crystalline/amorphous front growing out of the unmodified crystalline part of the sample) can limit amorphization if the front velocity is fast (e.g., tens of meters per second). The temperature rise required for RESET is more modest, on the order of about 200° C., however RESET requires a much longer time (e.g., about 500 ns for GST) to accomplish recrystallization.

The power required to melt the PCM material (e.g., a temperature on the order of about 600° C.) is supplied through a programming transistor, with the width of this transistor scaling in accordance with the programming current supplied thereby. In addition, the transistor width is a main factor in the area per stored memory bit. Thus, minimizing programming power is a key factor in minimizing the area per bit.

Accordingly, the key requirements that need to be demonstrated, and which can be tested by simulation, are the reasonableness of the maximum heater temperature required to melt the PCM, the rapid drop in temperature required to amorphize the PCM, and the power requirement.

3D Simulations of Heat Flow

Thermal simulations are based on solving the thermal diffusion equation:

$$C_V dT/dt = \nabla K \nabla T + H$$

for the temperature T(r,t), with specific heat at constant volume, $C_V$, diffusion coefficient, K(T), and heating rate, H(r,t). Material properties are taken as temperature-independent and typical for the corresponding materials.

Figure 6A:
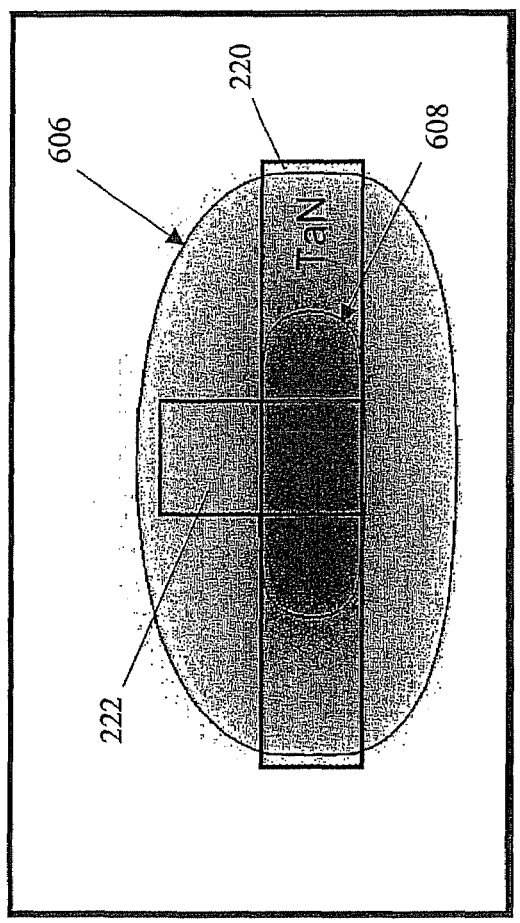
FIGS. 6(a) through 6(c) illustrate temperature contours resulting from a PCM heating simulation of a device similar to the embodiment of FIGS. 2(a) through 2(c)
Figure 6C:
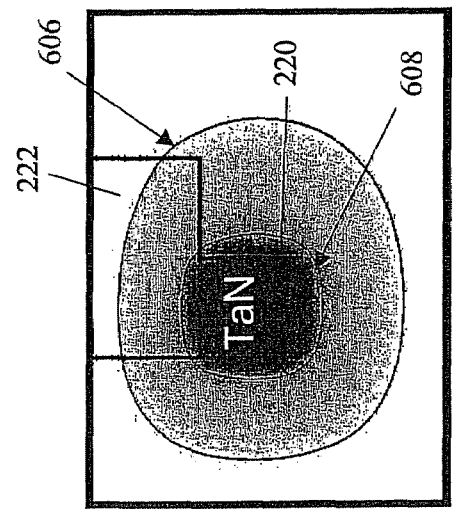
Figure 6B:
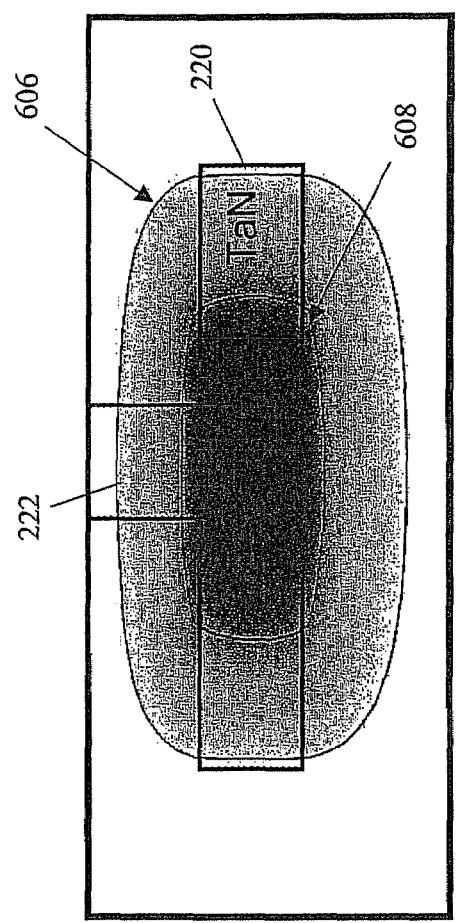

FIGS. 6(a) through 6(c) are top, side and front views, respectively, illustrating the results of a 3D thermal simulation for a heater element 220 with outer dimensions of 360 nm×200 nm×145 nm (length, width, height) and a PCM element 222 with dimensions of 40 nm×80 nm×40 nm. The peak temperature in the PCM element 222 during SET is found to be about 730° C., with the heater element on for about 70 ns at 0.2 mW. Lower power for longer times will yield about the same results. The temperature distribution shown in FIGS. 6(a) through 6(c) just before quenching includes an outer temperature contour 606 at about 255° C. and an inner temperature contour 608 at the PCM melting temperature, assumed to be about 607° C. The melt temperature needs to extend into the PCM material for only a small distance away from the heater in order to break the electrical pathway from the sense voltage to the ground.

Materials Issues

The BEOL location of the PCM NVM cell, which is desirable to avoid contamination of the silicon structures by the PCM material, does introduce the possibility of damage the low-K material (e.g., SiCOH) by the high temperatures reached during RESET. Although available design solution to this high temperature issue is presented in U.S. application Ser. No. 11/467,294 (assigned to the assignee of the present application, the contents of which are incorporated herein in their entirety), additional embodiments that also avoid excessive heating of the environment are described below.

Manufacture

As indicated above, FIGS. 7 through 11 are top and cross-sectional views illustrating a more detailed, sequential description of an exemplary method of forming the device of FIG. 2. As also indicated previously, the embodiments described herein are formed in conformance with standard CMOS processing. FIGS. 7(a) through 7(c) depict a simplified version of top down and cross-sectional views after STI (shallow trench isolation) 204 formation, gate conductor 208 (e.g., polysilicon) formation, and source/drain diffusion region 206 doping in accordance with standard CMOS processing. Standard CMOS processing is also followed up to M1 metal line formation, which is illustrated in FIGS. 8(a) through 8(c). For example, a nitride etch stop layer (not shown) and middle of line (MOL) dielectric 214 are deposited and planarized. The metal stud (CA) 212 is formed with the MOL dielectric 214, in contact with one of the source/drain diffusion regions 206. Then, a BEOL low-K dielectric 215, such as SiCOH for example, is deposited and patterned for an M1 metal copper damascene process. M1 barrier metals and copper seed layer are deposited and M1 copper is electroplated and planarized.

Then, as shown in FIGS. 9(a) through 9(c), an etch stop layer 216 (e.g., N-BloK) is deposited, followed by a thin layer 218 (e.g., about 300 Å) of low-K SiCOH and a thin layer (e.g., about 300 Å) of TaN. The TaN layer (which is used as a resistor material in conventional CMOS processing) is used as heater for the subsequently PCM material in our invention. The TaN layer is patterned so as to form the heater 220 through lithography and etching techniques. As shown in FIGS. 10(a) through 10(c), a PCM material such as GST (GeSbTe) or GeSb is deposited and patterned to form a PCM NVM (phase change material non-volatile memory) element 222. The PCM element patterning is implemented through lithography and etching. Finally, FIGS. 11(a) through 11(c) illustrate the top down and cross sections after V1 and M2 dual damascene metal (e.g., W) deposition and planarization, using additional low-K dielectric formation. Subsequent device processing is carried out in accordance with standard CMOS processing techniques.

Second Exemplary Embodiments

Figure 12:
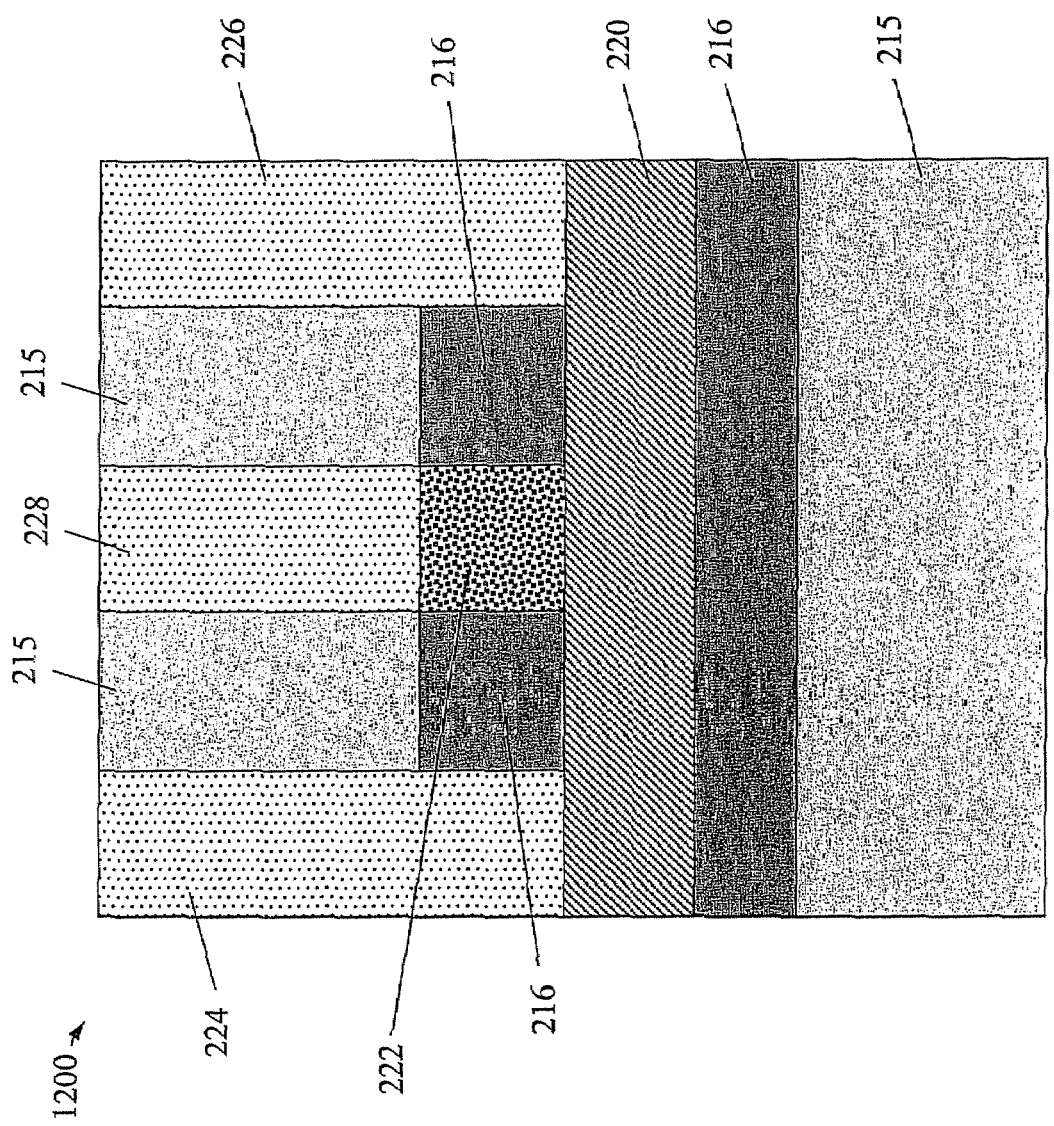
FIG. 12 is a side view of a programmable eFUSE device using an externally heated PCM, and which is formed at a BEOL level of device processing, in accordance with an alternative embodiment of the invention.
Figure 13:
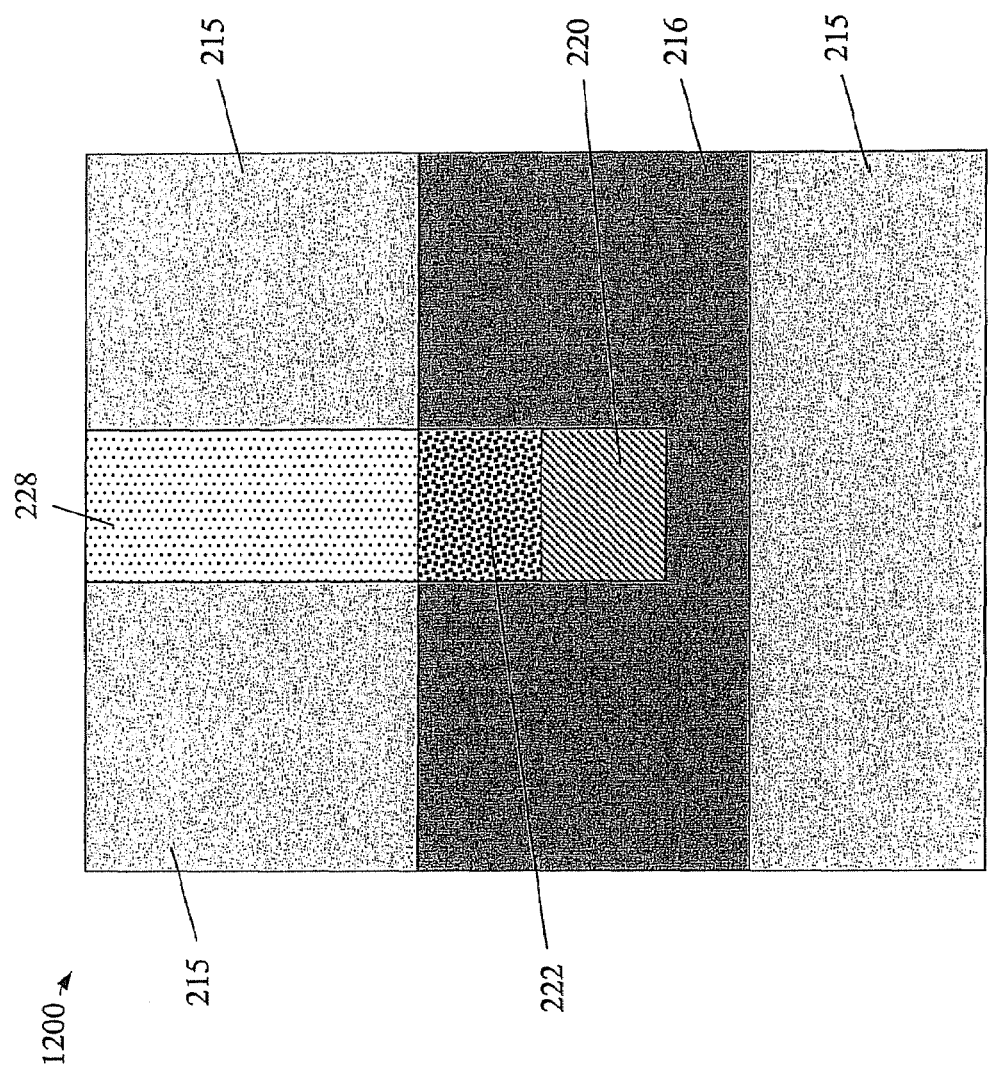
FIG. 13 is a front view of the device shown in FIG. 12.

Referring now to FIGS. 12 and 13, there is shown side and front views, respectively, of another exemplary embodiment of a BEOL PCM element 1200 designed to have a cool boundary in all directions, including the space surrounding the heater element 220. For purposes of clarity, similar structural elements are designated using the same reference numeral with respect to the various embodiments described herein. This type of design in FIGS. 12 and 13 is useful in the event that the dielectric material (e.g., such as SiCOH 215) of the manufacturing level in which the device is formed is temperature sensitive. At the same time, it is desired to reprogram the PCM element 1200 a large number of times while maintaining stable device performance. Accordingly, in this embodiment, the sides of both the heater 220 and PCM 222 are surrounded by thermal and electrical insulator 216 such as N-BLoK, for example.

As compared with the embodiment of FIG. 2, the heater element 220 is also formed directly upon the N-BLoK 216 instead of the low-K SiCOH 215. Formation of the N-BLoK layers 216 may be integrated within BEOL processing techniques. As is also the case with the embodiment of FIG. 2, vias 224 and 226 are formed at opposite ends of the heater strip 220 so as to facilitate a programming current path therethrough, while a third via 228 is used to define a sense current path through the PCM element 222, the heater 220 and via 224.

FIGS. 14(a) through 14(c) are top, side and front views, respectively, illustrating the results of a 3D thermal simulation for a heater element 220 with outer dimensions of 200 nm×200 nm×255 nm (length, width, height) and a PCM element 222 with dimensions of 40 nm×40 nm×40 nm. The peak temperature in the PCM element 222 during SET is found to be about 793° C., with the heater element on for about 30 ns at 0.4 mW. The temperature distribution shown in FIGS. 14(a) through 14(c) just before quenching includes an outer temperature contour 1404 at about 255° C. and an inner temperature contour 1402 at the PCM melting temperature, assumed to be about 607° C. Furthermore, the temperature of the SiCOH material 215 remains low while the PCM 222 in contact with the heater 220 is melted.

Figure 15:
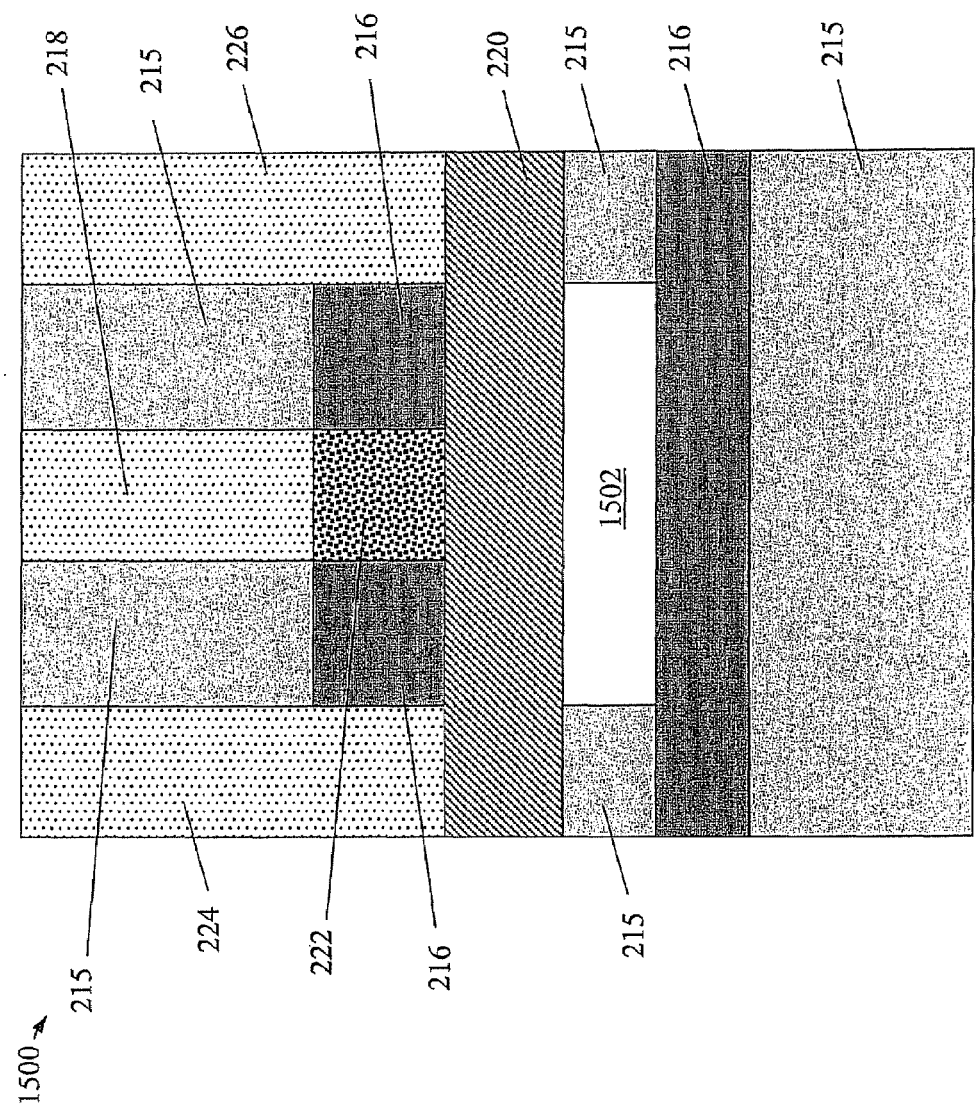
FIG. 15 is a side view of a programmable eFUSE device using an externally heated PCM, and which is formed at a BEOL level of device processing, in accordance with an alternative embodiment of the invention.
Figure 16:
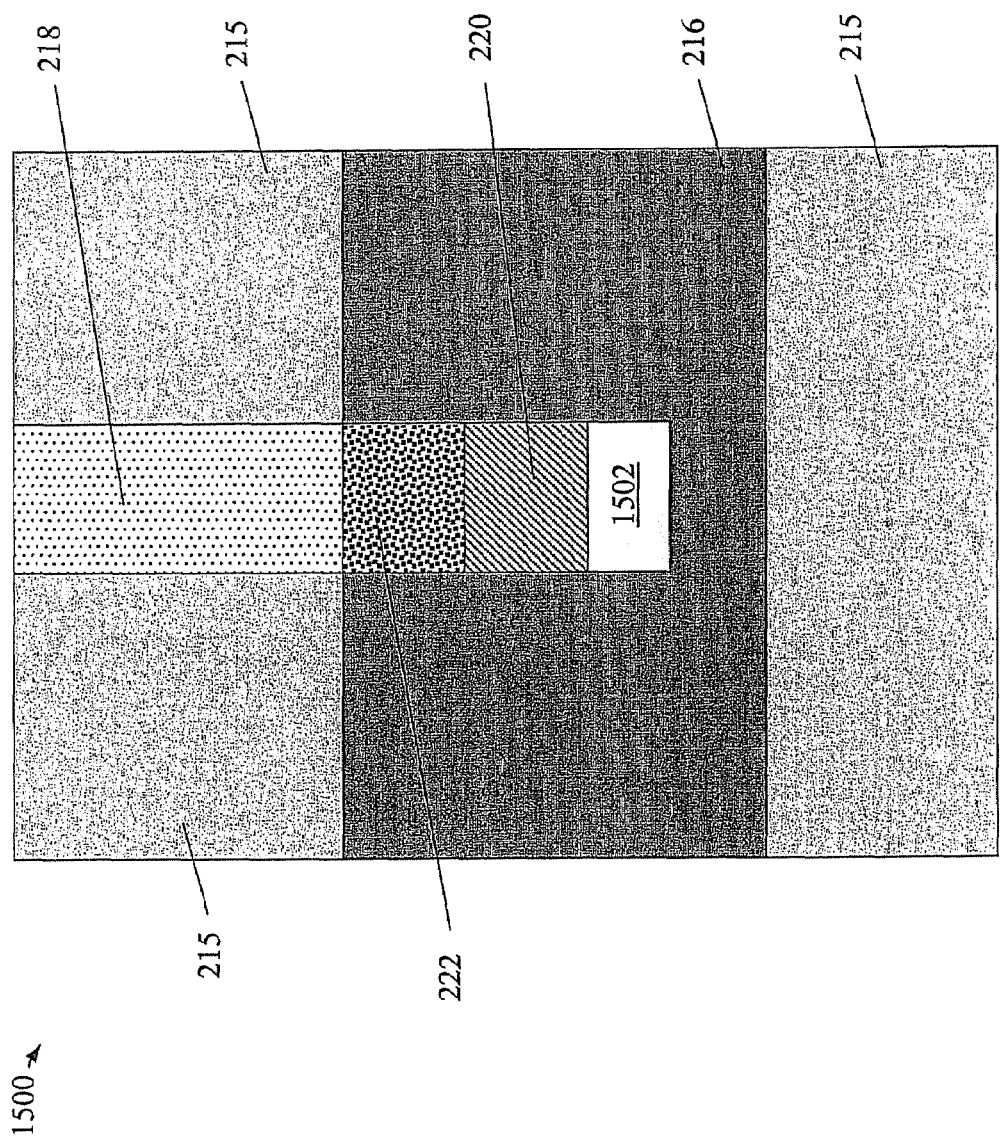
FIG. 16 is a front view of the device shown in FIG. 15.

Referring now to FIGS. 15 and 16, there is shown side and front views, respectively, of another exemplary embodiment of a BEOL PCM element 1500 designed to have a cool boundary in all directions, including the space surrounding the heater element 220. With respect to the design of FIGS. 12 and 13, element 1500 further introduces the use of an air gap 1502 formed beneath the heater 220 so as to provide thermal insulation between the heater 220 and SiCOH dielectric 215 (in addition to the N-BLoK material 216. However, in contrast to the embodiment of FIGS. 12 and 13 (but similar to that of FIG. 2), the heater material (e.g., TaN) is deposited on a thin layer of SiCOH dielectric 215 instead of directly upon a layer of N-BLoK 216. After patterning the TaN material to form the heater 220, isotropic etch steps (e.g., DHF clean & resist strip) creates an air gap 1502 under the TaN heater 220. The dimensions of the air-gap may be controlled by controlling the wet etch steps. As particularly shown in FIG. 15, some SiCOH material 215 is left below the TaN where the dimension is large and the structure will be mechanically robust.

Third Exemplary Embodiment

As mentioned previously, in some materials the dominance of the heterogeneous crystallization mechanism (i.e., the re-invasion of the amorphous region by the crystalline/amorphous front growing out of the unmodified crystalline part of the sample) can limit amorphization if the front velocity is fast. This is because the melted and amorphizable layer in the PCM bar is relatively thin (e.g., in the range of about 10-100 nm), and hence the time taken by the invading recrystallization front may be shorter than the cooling time in the RESET process, thereby preventing amorphization from occurring.

Figure 17A:
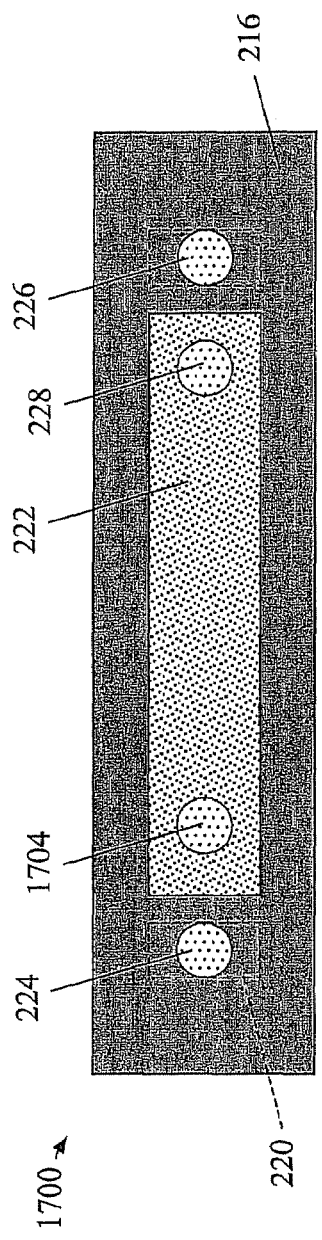
FIGS. 17(a) and 17(b) are top and side views, respectively side view of a programmable eFUSE device using an externally heated PCM, and which is formed at a BEOL level of device processing, in accordance with still an alternative embodiment of the invention.
Figure 17B:
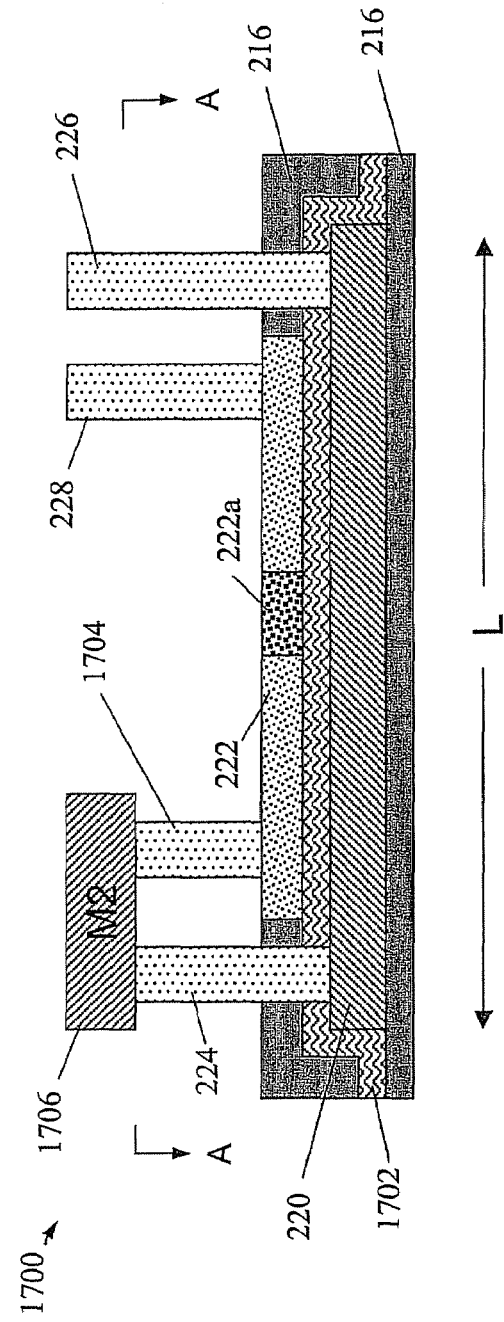

Accordingly, FIGS. 17(*a*) and 17(*b*) are top and side views, respectively, of another exemplary embodiment of a BEOL PCM element 1700 designed to operate with PCM materials having a fast recrystallization front. In this embodiment, a relatively long heater of length L is used (e.g., about 500-700 nm). Furthermore, the thickness of the PCM element 222 is made as low as practically possible for a continuous film (e.g., about 10 nm-25 nm), so that it is melted through the entire thickness thereof during the SET process. As also shown in FIG. 17(*b*), a thin electrically insulating layer 1702 (e.g., about 5 nm of $SiO_2$) formed between the heater 220 and the PCM 222. The electrically insulating layer 1702 is intended to block electrical conduction between the heater 220 and the PCM 222, while having little effect on heat propagation from the heater 220 into the PCM 222, whose effusivity is an order of magnitude below that of $SiO_2$.

Thus configured, the recrystallization process (assumed heterogeneous) will occur through the front between the central, melted portion of the PCM and the unmelted portion at the ends (which are cooled due to heat sinking by the vias). This front will move inward to recrystallize the melted material. However, upon turning off the heater current, cooling primarily occurs into the heater 220 along the negative z direction, while at constant a recrystallization front velocity the recrystallization front moves along the x direction, taking a time proportional to L/2 to reach the center of the heater. Because the cooling time of the heater is independent of L, by extending the dimension L the cooling time can therefore be made shorter than the recrystallization time so that there will be an amorphous region 222*a* at the center of the PCM sample left after SET. By way of example, the cooling time represents a time taken for the heater to cool from a temperature range of about 650-1000° C. to about 500° C., at which point the recrystallization kinetics become very slow.

The viability of the sense operation depends on the presence of the thin electrically insulating layer 1702; otherwise, the high-resistance amorphous region 222*a* could be shorted out during a sense operation by virtue of a direct connection between the PCM material and the heater 220. Therefore, following SET, the electrical conductivity between the sense and common terminals is blocked by the amorphous region 222*a*, and the resistance is very high. On the other hand, because there is no direct contact between the PCM 222 and the heater 220, a sense current path still needs to be through the length of the PCM 222 and to one end of the heater 220 (which end is also common to the programming current path of the heater current). Therefore, FIGS. 17(*a*) and 17(*b*) also depict the formation of an additional via 1704 which is electrically coupled to via 224 (and hence to one end of the heater 220) through M2 wiring 1706. As an alternative to using via 1704 and M2 wire 1706 to connect to via 224 (and hence to the heater 220) for the sense current path, it also be equally feasible to form a small via through $SiO_2$ layer 1702 to electrically couple the PCM 222 to the heater 220, provided the via is on the opposite side of the amorphous region 222*a* with respect to the sense voltage via 228.

Finally, FIGS. 18(*a*) through 18(*c*) are top, side and front views, respectively, illustrating the results of a 3D thermal simulation for a heater element 220 during a SET operation with outer dimensions of 650 nm×200 nm×190 nm (length, width, height) and a PCM element 222 with dimensions of 330 nm×80 nm×20 nm. The peak temperature in the PCM element 222 during SET is found to be about 1330° C., with the heater element on for about 70 ns at 1.12 mW. The temperature distribution shown in FIGS. 18(*a*) through 18(*c*) just before quenching includes an outer temperature contour 1804 at about 255° C. and an inner temperature contour 1802 at the PCM melting temperature, assumed to be about 607° C.

The melting temperature is only achieved in the central region of the PCM, as required for formation of the recrystallization front at the edges of the PCM bar. The inner temperature contour 1802, which is the melt temperature, extends throughout the thickness of the PCM in the central region and extends for the full width of this strip as well. Thus, there is no conducting path along the strip after the RESET. The peak temperature in the heater and the power requirement will be smaller if the heating time is longer.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A programmable phase change material (PCM) structure, comprising:
    a heater element formed at a back end of line (BEOL) level of a semiconductor device, the BEOL level including a low-K dielectric material therein;
    a first via in electrical contact with a first end of the heater element and a second via in electrical contact with a second end of the heater element, thereby defining a programming current path which passes through the first via, the heater element, and the second via;
    a PCM element disposed above the heater element, wherein the PCM element is configured to be programmed between a lower resistance crystalline state and a higher resistance amorphous state through the use of SET and RESET programming currents through the heater element; and
    a third via in electrical contact with the PCM element, thereby defining a sense current path which passes through the third via, the PCM element, the heater element, and the second via, wherein the sense current path is used to detect the programmed resistance state of the PCM element.

2. The programmable PCM structure of claim 1, wherein the PCM element is formed directly upon the heater element.

3. The programmable PCM structure of claim 2, further comprising a thermal, electrical insulating material disposed between the heater element and the low-K dielectric material of the BEOL level.

4. The programmable PCM structure of claim 3, wherein the thermal, electrical insulating material is also disposed between the PCM element and the low-K dielectric material of the BEOL level.

5. The programmable PCM structure of claim 3, further comprising an air gap formed between a bottom surface of the heater and a layer of the thermal, electrical insulating material.

6. The programmable PCM structure of claim 5, wherein the thermal, electrical insulating material is also disposed between the PCM element and the low-K dielectric material of the BEOL level.

7. The programmable PCM structure of claim 1, further comprising a thermally conductive, electrically insulating layer formed between the heater element and the PCM element.

8. The programmable PCM structure of claim 7, wherein the PCM element material comprises a binary material of the form $Ge_xSb_y$.

9. The programmable PCM structure of claim 7, wherein a length, L, of the heater element is configured such that a cooling time of the heater element is shorter than recrystallization time of the PCM element, wherein the cooling time of the heater element in independent of L and the recrystallization time of the PCM element is dependent upon L.

10. The programmable PCM structure of claim 7, further comprising:
a fourth via in electrical contact with the PCM element, wherein the third and fourth vias are disposed at opposing sides with respect to an amorphizable region of the PCM element; and
the fourth via also in electrical contact with the second via such that the sense current path passes through the third via, the PCM element, the fourth via, the second via, and the heater element.

11. The programmable PCM structure of claim 7, wherein the thermally conductive, electrically insulating layer comprises $SiO_2$.

12. The programmable PCM structure of claim 1, wherein the low-K dielectric material comprises SiCOH.

13. The programmable PCM structure of claim 3, wherein the thermal, electrical insulating material comprises N-BLoK.

14. The programmable PCM structure of claim 1, wherein the heater element comprises TaN.

15. A non-volatile, programmable phase change material (PCM) memory array, comprising:
a plurality of memory cells arranged in rows and columns, with each memory cell comprising a heater element formed at a back end of line (BEOL) level of a semiconductor device, the BEOL level including a low-K dielectric material therein;
a first via in electrical contact with a first end of the heater element and a second via in electrical contact with a second end of the heater element, thereby defining a programming current path which passes through the first via, the heater element, and the second via;
a PCM element disposed above the heater element, wherein the PCM element is configured to be programmed between a lower resistance crystalline state and a higher resistance amorphous state through the use of SET and RESET programming currents through the heater element; and
a third via in electrical contact with the PCM element, thereby defining a sense current path which passes through the third via, the PCM element, the heater element, and the second via, wherein the sense current path is used to detect the programmed resistance state of the PCM element; and
sensing circuitry configured to sense the resistance of the PCM element.

16. The memory array of claim 15, further comprising a thermally conductive, electrically insulating layer formed between the heater element and the PCM element.

17. The memory array of claim 16, wherein the PCM element material comprises a binary material of the form $Ge_xSb_y$.

18. The memory array of claim 16, wherein a length, L, of the heater element is configured such that a cooling time of the heater element is shorter than recrystallization time of the PCM element, wherein the cooling time of the heater element in independent of L and the recrystallization time of the PCM element is dependent upon L.

19. The memory array of claim 16, further comprising:
a fourth via in electrical contact with the PCM element, wherein the third and fourth vias are disposed at opposing sides with respect to an amorphizable region of the PCM element; and
the fourth via also in electrical contact with the second via such that the sense current path passes through the third via, the PCM element, the fourth via, the second via, and the heater element.

20. A method of forming a programmable phase change material (PCM) structure, the method comprising:
forming a heater element at a back end of line (BEOL) level of a semiconductor device, the BEOL level including a low-K dielectric material therein;
forming a first via in electrical contact with a first end of the heater element and a second via in electrical contact with a second end of the heater element, thereby defining a programming current path which passes through the first via, the heater element, and the second via;
forming a PCM element above the heater element, wherein the PCM element is configured to be programmed between a lower resistance crystalline state and a higher resistance amorphous state through the use of SET and RESET programming currents through the heater element; and
forming a third via in electrical contact with the PCM element, thereby defining a sense current path which passes through the third via, the PCM element, the heater element, and the second via, wherein the sense current path is used to detect the programmed resistance state of the PCM element.

* * * * *

UNITED STATES PATENT AND TRADEMARK OFFICE
CERTIFICATE OF CORRECTION

| | | |
|---|---|---|
| PATENT NO. | : 7,633,079 B2 | Page 1 of 1 |
| APPLICATION NO. | : 11/850742 | |
| DATED | : December 15, 2009 | |
| INVENTOR(S) | : Chen et al. | |

It is certified that error appears in the above-identified patent and that said Letters Patent is hereby corrected as shown below:

On title page Item (75) Column 1, Inventors, delete "g" from inventor Kuan[g]-Neng Chen's name Signed and Sealed this Second Day of February, 2010

David J. Kappos
*Director of the United States Patent and Trademark Office*